(12) United States Patent
Kamioka et al.

(10) Patent No.: US 9,465,385 B2
(45) Date of Patent: Oct. 11, 2016

(54) INSPECTING DEVICE MONITORING SYSTEM

(71) Applicant: CKD Corporation, Aichi (JP)

(72) Inventors: Yosuke Kamioka, Aichi (JP); Manabu Okuda, Aichi (JP); Shingo Suzuki, Aichi (JP)

(73) Assignee: CKD Corporation, Aichi (JP)

( * ) Notice: Subject to any disclaimer, the term of this patent is extended or adjusted under 35 U.S.C. 154(b) by 429 days.

(21) Appl. No.: 14/109,560

(22) Filed: Dec. 17, 2013

(65) Prior Publication Data

US 2014/0200700 A1 Jul. 17, 2014

(30) Foreign Application Priority Data

Jan. 11, 2013 (JP) .................................. 2013-003782

(51) Int. Cl.
*G06F 19/00* (2011.01)
*G05B 19/418* (2006.01)
*H05K 13/08* (2006.01)

(52) U.S. Cl.
CPC ......... *G05B 19/41875* (2013.01); *H05K 13/08* (2013.01); *G05B 2219/32209* (2013.01); *G05B 2219/37217* (2013.01); *Y02P 90/22* (2015.11)

(58) Field of Classification Search
CPC .............. G06T 7/0002; G06T 7/0008; G01N 21/95607; G01N 35/00613; G01N 35/00722; G06F 11/3688; G06F 11/3664; Y10T 29/53022; G05B 19/41875; G05B 19/4184; G05B 2219/32209; G06K 9/036
See application file for complete search history.

(56) References Cited

U.S. PATENT DOCUMENTS

| | | | | |
|---|---|---|---|---|
| 6,035,243 A | * | 3/2000 | Galuga | G05B 19/41805 700/110 |
| 7,007,038 B1 | * | 2/2006 | Kazemi | G06Q 10/06 |
| 7,809,458 B2 | * | 10/2010 | Sasko | G05B 19/41875 700/101 |
| 8,761,490 B2 | * | 6/2014 | Scheid | G01N 21/8851 382/145 |
| 9,007,458 B2 | * | 4/2015 | Terreno | G06T 7/0004 348/128 |

(Continued)

FOREIGN PATENT DOCUMENTS

| | | |
|---|---|---|
| JP | 4417400 B2 | 2/2010 |
| JP | 201182376 A | 4/2011 |
| WO | 2005009101 A1 | 1/2005 |

OTHER PUBLICATIONS

Office Action in corresponding Japanese application No. 2013-003782 dated Feb. 4, 2015 (8 pages).

*Primary Examiner* — Darrin Dunn
(74) *Attorney, Agent, or Firm* — Osha Liang LLP

(57) ABSTRACT

In a monitoring system, when there is an evaluation that a product is defective, in a solder print inspecting device that is subject to monitoring, that information is sent to a mobile terminal possessed by an operator. The operator who views the notification performs, through the mobile terminal, a checking task for evaluating whether or not the evaluation result regarding the printed substrate that has been evaluated as a defective product is correct. Depending on the evaluation result, an operating instruction is sent to the solder print inspecting device, which has temporarily stopped the printed substrate. If correction information instructing that the defective-product evaluation be corrected to a non-defective-product evaluation is sent from a mobile terminal to the solder print inspecting device, the solder print inspecting device corrects the defective-product evaluation to a non-defective-product evaluation, and releases the temporary stop of the printed substrate.

9 Claims, 14 Drawing Sheets

(56) References Cited

U.S. PATENT DOCUMENTS

| | | | |
|---|---|---|---|
| 2002/0132343 A1* | 9/2002 | Lum | C12N 5/0647 435/372 |
| 2002/0198618 A1* | 12/2002 | Madden | B62D 65/02 700/101 |
| 2004/0128653 A1* | 7/2004 | Arcand | G06F 11/3688 717/124 |
| 2004/0129046 A1* | 7/2004 | Benaglio | B05B 13/0278 72/6.1 |
| 2004/0140825 A1* | 7/2004 | Zemer | G01R 31/2887 324/750.22 |
| 2004/0225390 A1* | 11/2004 | Keller | G06Q 10/06 700/95 |
| 2005/0060057 A1* | 3/2005 | Wu | G05B 19/41875 700/109 |
| 2005/0075841 A1* | 4/2005 | Peles | G06T 7/0004 702/185 |
| 2006/0082763 A1* | 4/2006 | Teh | G01N 21/9501 356/72 |
| 2006/0200264 A1 | 9/2006 | Kodama et al. | |
| 2006/0203232 A1* | 9/2006 | Okita | G03F 1/84 356/237.2 |
| 2006/0233434 A1* | 10/2006 | Hamamatsu | G06K 9/2027 382/149 |
| 2008/0181484 A1* | 7/2008 | Litichever | G06T 7/001 382/145 |
| 2009/0169092 A1* | 7/2009 | McCleary | G06K 9/033 382/141 |
| 2010/0139222 A1* | 6/2010 | Federle | B65B 57/20 53/474 |
| 2011/0244814 A1* | 10/2011 | Andreu | G01R 31/31722 455/90.1 |
| 2011/0270432 A1* | 11/2011 | Carpenter | G05B 19/41805 700/110 |
| 2012/0027285 A1* | 2/2012 | Shlain | G06K 9/6256 382/149 |
| 2012/0209415 A1* | 8/2012 | Casanelles | B25J 9/0084 700/109 |
| 2012/0256180 A1* | 10/2012 | Tailliet | H01L 22/34 257/48 |
| 2013/0002852 A1* | 1/2013 | Bertin | G01N 21/95607 348/92 |
| 2013/0113914 A1* | 5/2013 | Scheid | G01N 21/8851 348/82 |
| 2013/0144416 A1* | 6/2013 | Rataul | G05B 19/41805 700/95 |
| 2013/0151428 A1* | 6/2013 | Hesse | G06Q 10/06395 705/318 |
| 2013/0279796 A1* | 10/2013 | Kaizerman | G06K 9/6256 382/149 |
| 2014/0036260 A1* | 2/2014 | Nygaard | B07C 5/342 356/237.2 |
| 2014/0098615 A1* | 4/2014 | Mu | G11C 16/344 365/185.22 |
| 2014/0152816 A1* | 6/2014 | Pratt | G10L 15/26 348/143 |
| 2014/0168309 A1* | 6/2014 | Morita | B41J 11/42 347/16 |
| 2014/0200701 A1* | 7/2014 | Kent | A61F 13/15772 700/110 |
| 2015/0092814 A1* | 4/2015 | Wolfgruber | G01N 25/72 374/121 |
| 2015/0291382 A1* | 10/2015 | Moh | B31B 1/00 493/12 |

* cited by examiner (a) Operator A (b) Operator B

Operator B

Operator B

Operator A

Operator B

Operator C

INSPECTING DEVICE MONITORING SYSTEM

CROSS-REFERENCE TO RELATED APPLICATIONS

This application claims priority to Japanese Patent Application No. 2013-003782 filed on Jan. 11, 2013 in Japan.

BACKGROUND OF INVENTION

1. Field of the Invention

The present invention relates to a monitoring system for monitoring the operating status of an inspecting device in a factory, or the like.

2. Background Art

In a production line for mounting electronic components on a printed substrate, or the like, first a cream solder is printed on the lands that are provided on the printed substrate. Following this, electronic components are temporarily secured based on the viscosity of the cream solder. Thereafter, the printed substrate is placed into a reflow oven to perform soldering through a specific reflow process.

In such a production line, typically a solder inspecting device is provided in order to inspect the state of printing of the cream solder, and to reject a printed substrate that is evaluated as a defective product.

However, there is the possibility that printed substrates that are evaluated as defective products may include those that can be handled as non-defective products. Because of this, conventionally, at the point in time that a defective product is produced, the solder print inspecting device is stopped temporarily and an operator is notified. Given this, the operator goes to the solder print inspecting device wherein the defective product occurred to reference the inspection result to check whether or not the defective-product evaluation was correct. If the printed substrate that has been evaluated as a defective product is a non-defective product, then the evaluation by the solder print inspecting device is corrected, and that printed substrate is sent downstream as a non-defective product. On the other hand, if it is determined that the evaluation by the solder print inspecting device was correct, then, the printed substrate is rejected as a defective product.

In recent years, technologies have been disclosed wherein a central controlling device for performing centralized control of a plurality of solder print inspecting devices is provided, where, in monitoring the central controlling device, it is possible to display the inspection results, and the like, of the individual solder print inspecting devices, making it possible for an operator to perform, on the central controlling device, the same conventional checking task of checking whether or not the defective-product evaluations are correct, for a plurality of solder print inspecting devices (See, for example, Patent Citation 1).

[Patent Citation 1] Japanese Patent 4,417,400

SUMMARY OF INVENTION

However, in the conventional technology and in the structure in Patent Citation 1, if a defective product occurs with a specific inspecting device, the operator must go to the applicable inspecting device or to the central controlling device to perform the checking task described above. Because of this, it is necessary to stop the production line while the operator goes to the inspecting device or the central controlling device, which may lead to a remarkable reduction in productivity.

In response, one may consider having an operator remain constantly at the inspecting device or central controlling device, and may consider performing periodic monitoring, but, when viewed as a whole, the frequency with which defective products are detected by the inspecting devices is certainly not high, so having an operator engaged in such work has poor production efficiency from the perspective of personnel as well.

Note that the above issue is not limited to inspecting devices that inspect printed substrates, but rather applies to other types of inspecting devices as well, such as any type of inspecting device that requires a checking task by an operator when a defective product is produced.

One or more embodiments of the present invention were created in contemplation of the situation set forth above, and one or more embodiments of the present invention provide an inspecting device monitoring system whereby it is possible to achieve improved productivity.

One or more embodiments of the present invention may address one or more of the above issues, as will be explained individually below. As may be required, the characteristic operational effects of the various embodiments will also be described.

Embodiments 1: in one or more embodiments of the present invention, an inspecting device monitoring system for monitoring the operating status of one or more inspecting devices that have an inspecting unit for performing specific inspections (for example, three-dimensional measurements) regarding specific inspection objects (for example, printed substrates) that are conveyed and arrive sequentially, and a evaluating unit for performing defective/non-defective-product evaluations on the inspection objects of based on inspection information obtained by the inspecting unit, includes one or more mobile terminals, possessed by one or more operators, and including a communicating unit capable of communicating with one or more inspecting devices through a specific communication circuit. The inspecting device includes a temporary stopping unit for stopping temporarily defective-product rejection of, at least, an inspection object relating to a defective-product evaluation, when there has been a defective-product evaluation by the evaluating unit; and the communicating unit, structured so as to enable communication with one or more mobile terminals through the communication circuit, which, when there is a temporary stop of the inspection object relating to the defective-product evaluation, are able to send to one or more mobile terminals operating information (for example, temporary stop information) for the inspecting device indicating the temporary stop and inspection information (for example, image data, results of a three-dimensional measurement, or the like) relating to the inspection object relating to the defective-product evaluation. The mobile terminal includes a displaying unit capable of displaying, as a task item, information indicating a need for a checking task for the inspection object relating to the defective-product evaluation, by at least an operator, based on operating information received from the inspecting device when at least the inspecting device has temporarily stopped the inspection object pertaining to the defective-product evaluation, and able to display the inspection information received from the inspecting unit; and an inputting unit whereby an operator can input, through at least the displaying unit, an evaluation result of an evaluation regarding the whether or not the evaluation result regarding the inspection object that has been evaluated as a defective product is correct. If correction information for correcting a defective-product evaluation to a non-defective-product evaluation, as an operator instruction based on the evaluation result by the operator, is sent from the mobile terminal to the inspecting device, the inspecting device corrects the defective-product evaluation to a non-defective-product evaluation, and releases the temporary stop.

According to the above described Embodiments 1, when there is a defective-product evaluation in an inspecting device that is subject to monitoring, information pertaining thereto is sent to a mobile terminal possessed by an operator. The operator views the notification and performs, through the mobile terminal, the checking task, for evaluating whether or not the evaluation result is correct for the inspection object that has been evaluated as a defective product. An instruction for an operation based on the evaluation result thereof is sent to the inspecting device that has temporarily stopped the inspection object. If, at this time, correction information indicating that the defective-product evaluation is to be corrected to a non-defective-product evaluation is sent from the mobile terminal to the inspecting device, then the inspecting device corrects the defective-product evaluation by the evaluating unit to a non-defective-product evaluation, and releases the temporary stop on the inspection object.

The structure set forth above eliminates the need for the operator to go through the trouble of going to the inspecting device, even in the event of a defective product in a specific inspecting device, making it possible to perform the checking task on the spot, through the mobile terminal. That is, this makes it possible to eliminate the time required for the operator to go to the inspecting device, thereby shortening the time over which the inspecting device is stopped. As a result, this enables the achievement of an improvement in operating efficiency, an improvement in the utilization rate of the inspecting devices, and, by extension, an improvement in the utilization rate of the production lines, thereby enabling an improvement in the production efficiency.

In other words, because even if the operator is assigned to a different task, at a location away from the inspecting device, the operator is still able to perform the checking task, described above, from that spot, this enables the achievement of an improvement in the overall operating efficiency.

Embodiments 2: In one or more embodiments of the present invention, an inspecting device monitoring system for monitoring the operating status of one or more inspecting devices that include a inspecting unit for performing specific inspections (for example, three-dimensional measurements) regarding specific inspection objects (for example, printed substrates) that are conveyed and arrive sequentially, and evaluating unit for performing defective/non-defective-product evaluations on the inspection objects of based on inspection information obtained by the inspecting unit includes a plurality of mobile terminals, possessed by a plurality of operators, and including a communicating unit capable of communicating with one or more inspecting devices and able to communicate with each other through a specific communication circuit. The inspecting device includes a temporary stopping unit for stopping temporarily defective-product rejection of, at least, an inspection object relating to a defective-product evaluation, when there has been a defective-product evaluation by the evaluating unit; and a communicating unit, structured so as to enable communication with a plurality of mobile terminals through the communication circuit, which, when there is a temporary stop of the inspection object relating to the defective-product evaluation, are able to send to the plurality of mobile terminals operating information (for example, temporary stop information) for the inspecting device indicating the temporary stop and inspection information (for example, image data, the results of a three-dimensional measurement, or the like) relating to the inspection object relating to the defective-product evaluation. The mobile terminal includes a displaying unit capable of displaying, as a task item, information indicating a need for a checking task for the inspection object relating to the defective-product evaluation, by at least an operator, based on operating information received from the inspecting device when at least the inspecting device has temporarily stopped the inspection object pertaining to the defective-product evaluation, and able to display the inspection information received from the inspecting unit; and an inputting unit whereby an operator who possesses the mobile terminal can select, as a task to be handled by said operator, a checking task relating to a task item displayed on the displaying unit, and whereby an operator can input, through the displaying unit, an evaluation result of an evaluation regarding the whether or not the evaluation result regarding the inspection object that has been evaluated as a defective product is correct. If a specific operator, using a mobile terminal possessed thereby, selected a checking task relating to a task item displayed on the displaying unit as an operation that said operator is to handle himself/herself, information to that effect is sent, as selection information, to a mobile terminal possessed by another operator, and the inspection information is displayed on the displaying unit. When the mobile terminal possessed by the other operator has received the selection information, the fact that the task item relating to the selection information has been selected is displayed by a specific status (such as being grayed out). If correction information for correcting a defective-product evaluation to a non-defective-product evaluation, as an operator instruction based on the evaluation result by the specific operator, is sent from the mobile terminal possessed by the specific operator to the inspecting device, the inspecting device corrects the defective-product evaluation to a non-defective-product evaluation, and releases the temporary stop.

The above described Embodiments 2 provides substantially similar operating effects to the Embodiments 1.

Note that if there is a plurality of operators who possess mobile terminals, multiple operators who have received the same information then performing identical checking tasks simultaneously could cause a remarkable reduction in operating efficiency.

On the other hand, even in a structure wherein an operator for performing the specific checking tasks were to be designated by the system side, and the information required for the checking task were to be sent to that operator alone, then this would not necessarily the lead to an improvement in operating efficiency because a task instruction may be sent to an operator who is busy with another task, notwithstanding the existence of another operator who is free.

In this regard, when a specific operator uses a mobile terminal in his or her own possession to select a specific task item as a task to perform himself or herself, the fact that the task item has been selected is displayed by a specific state. Doing so makes it possible for the other operators to ascertain that the specific operator will handle the checking task in relation to that task item.

As a result, only the operator that has selected the task item displayed on the mobile terminal will perform the checking task for that task item, thereby making it possible to prevent the occurrence of problems such as a plurality of operators, who have received identical information, all performing the same checking task at the same time, even when there is a plurality of operators who possess mobile terminals.

Additionally, because the structure is one wherein the operator is able to select, on the operator side, the task that he or she is to perform, when compared to a structure wherein an operator for performing a specific task is designated by the system side, it is less likely that there will be problems such as an operator becoming idle or another individual operator being given multiple tasks simultaneously.

The result is the ability to perform monitoring of inspecting devices by a plurality of operators efficiently, which, by extension, enables an increase in production efficiency. This is especially true when monitoring a plurality of inspecting devices.

Embodiments 3: In one or more embodiments of the present invention, an inspecting device monitoring system as set forth in the Embodiments 2, for a checking task relating to a task item that a specific operator has selected using the mobile terminal possessed by that operator, selection is disabled or execution is disabled in a mobile terminal possessed by the other operator.

The above described Embodiments 3 provides substantially similar effects to the Embodiments 2 with more reliability.

Embodiments 4: In one or more embodiments of the present invention, an inspecting device monitoring system as set forth in the Embodiments 3, includes an authorization transferring unit (for example, a "Call All" button or a "Call Individual" button, or the like) able to transfer authorization for performing the checking task so that a checking task relating to a task item that a specific operator has selected using the mobile terminal possessed by that operator can be selected or can be executed in a mobile terminal possessed by the other operator.

There are also cases wherein even when a specific operator attempts to perform the checking task, set forth above, it is difficult for that operator to perform the defective/non-defective-product evaluation due to the skill level of that operator. In such a case, if the structure were one wherein the authorization for a checking task, once selected by a specific operator, could not be transferred, then that operator would have to seek out, on his or her own, another operator to perform the defective/non-defective-product evaluation, which could lead to a remarkable decrease in operating efficiency and production efficiency.

In this regard, the Embodiments 4 enables an improvement in productivity, and the like, by preventing such an issue.

Embodiments 5: In one or more embodiments of the present invention, an inspecting device monitoring system as set forth in the Embodiments 4, includes a particular transferring unit (for example, a "Call Individual" button), as a authorization transferring unit. The specific operator is able to transfer authorization by indicating a particular other operator.

If the structure were one wherein, for example, a specific operator simply abandons authorization for a checking task and another operator were to receive authorization for that checking task at random, then there would be the possibility of the authorization being transferred from that specific operator, who was unable to perform the defective/non-defective-product evaluation for that checking task, to an operator with an even lower skill level, which could cause a remarkable reduction in operating efficiency and production efficiency.

In this regard, the specific operator who was unable to perform the defective/non-defective-product evaluation for that particular checking task may know a particular operator who has the skill level to be able to perform that defective/non-defective-product evaluation. In such a case, it is possible to achieve an improvement in productivity through transferring the authorization by designating that particular operator.

Embodiments 6: In one or more embodiments of the present invention, an inspecting device monitoring system as set forth in the Embodiments 4 or 5, includes a nonspecified transferring unit (for example, a "Call All" button), as an authorization transferring unit, wherein the specific operator is able to transfer authorization to a nonspecified other operator.

For example, the specific operator who was unable to perform the defective/non-defective-product evaluation for that particular checking task may not know a particular operator who has the skill level to be able to perform that defective/non-defective-product evaluation. In such a case, if, for example, the structure were one wherein it is not possible to transfer authorization by specifying a particular operator, then it would be necessary to search for another operator to perform the defective/non-defective-product evaluation by transferring the authorization sequentially to other operators one at a time, which could cause a remarkable reduction in operating efficiency and production efficiency.

In this regard, the Embodiments 6 enables an improvement in productivity, and the like, by preventing such an issue.

Note that in a structure wherein the authorization is transferred to another non-specific operator, preferably the structure will be one wherein the various operators are grouped in advance based on, for example, skill levels, and a priority order is established, for example, to facilitate transferring of authorization to an operator with a skill level that is higher than that of the specific operator.

Embodiments 7: In one or more embodiments of the present invention, an inspecting device monitoring system as set forth in any one of the Embodiments 1 through 6, includes a rejecting unit (for example, a branching device) able to reject an inspection object relating to a defective-product evaluation when there has been a defective-product evaluation by the evaluating unit. If confirming information indicating a confirmation of the defective-product evaluation, as an instruction of an operator based on an evaluation result by operator is sent from the mobile terminal to the inspecting device, the inspecting device releases the temporary stop and outputs a rejection signal, to the rejecting unit, indicating that the inspection object relating to the defective-product evaluation is to be rejected.

According to the above described Embodiments 7, even if it is confirmed that the product is a defective product, still it is not necessary for the operator to go through the effort to go to the inspecting device to reject that defective product. That is, this makes it possible to eliminate the time for the operator to go to the inspecting device in order to reject the defective product, making it possible to reduce the time over which the inspecting device is stopped. As a result, this enables the achievement of a further improvement in productivity.

Other aspects and advantages of the invention will be apparent from the following description and the appended claims.

DETAILED DESCRIPTION

One or more embodiments of the claimed invention will be explained below while referring to figures.

Figure 1:
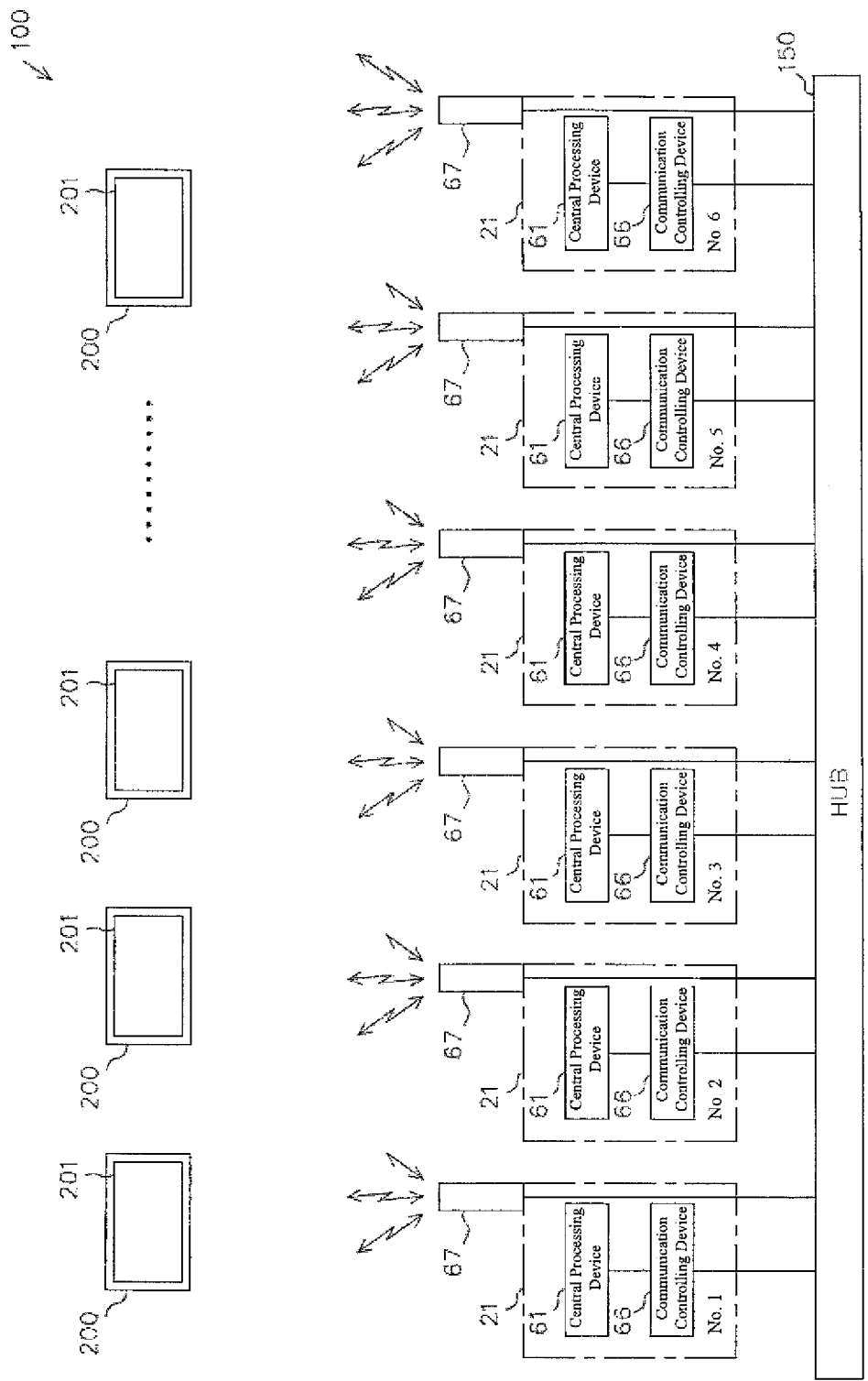
FIG. 1 is a structural diagram illustrating a schematic structure of an inspecting device monitoring system according to one or more embodiments of the present invention.
Figure 2:
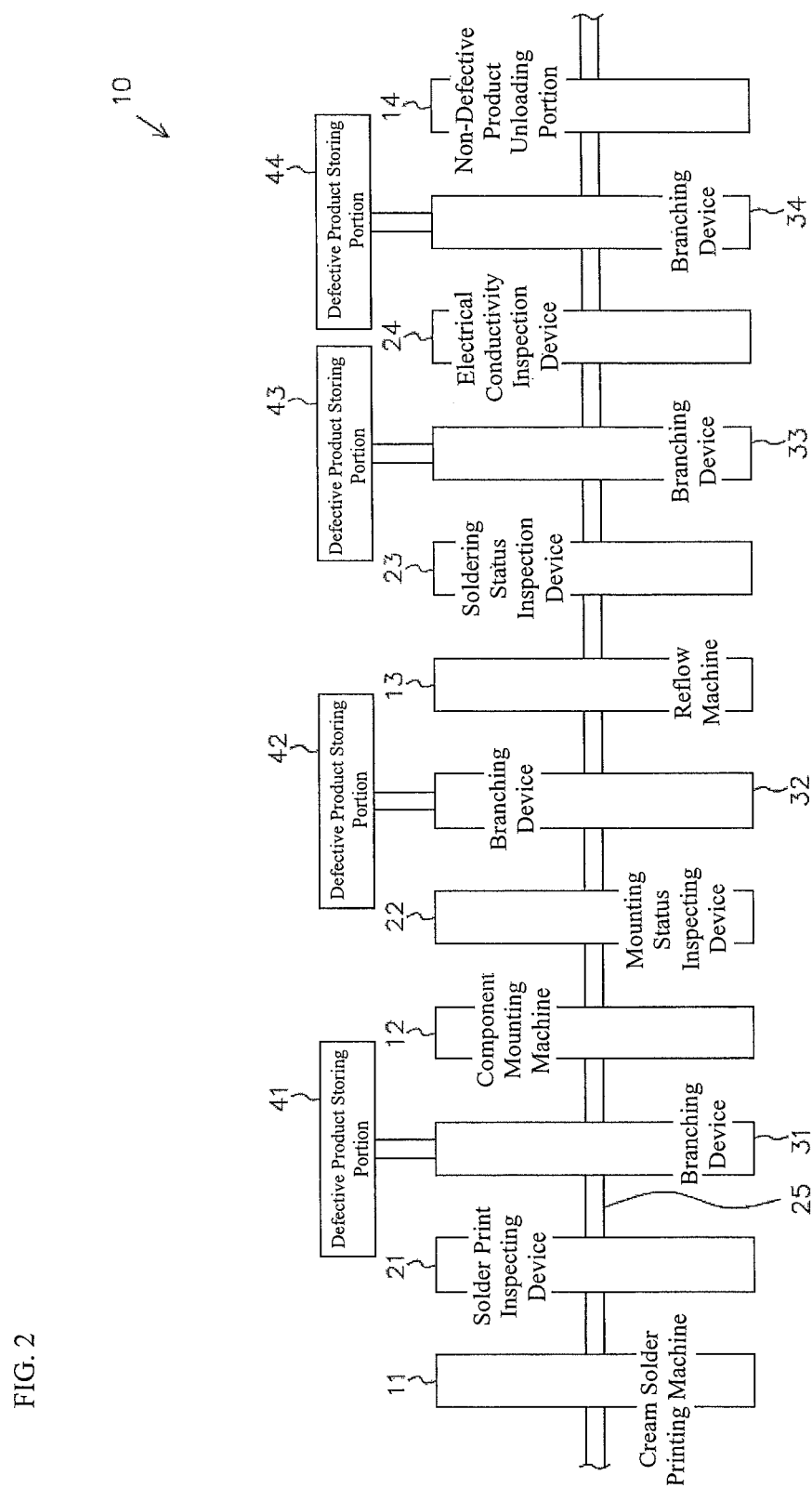
FIG. 2 is a structural diagram illustrating a schematic structure for a printed substrate production line according to one or more embodiments of the present invention.
Figure 3:
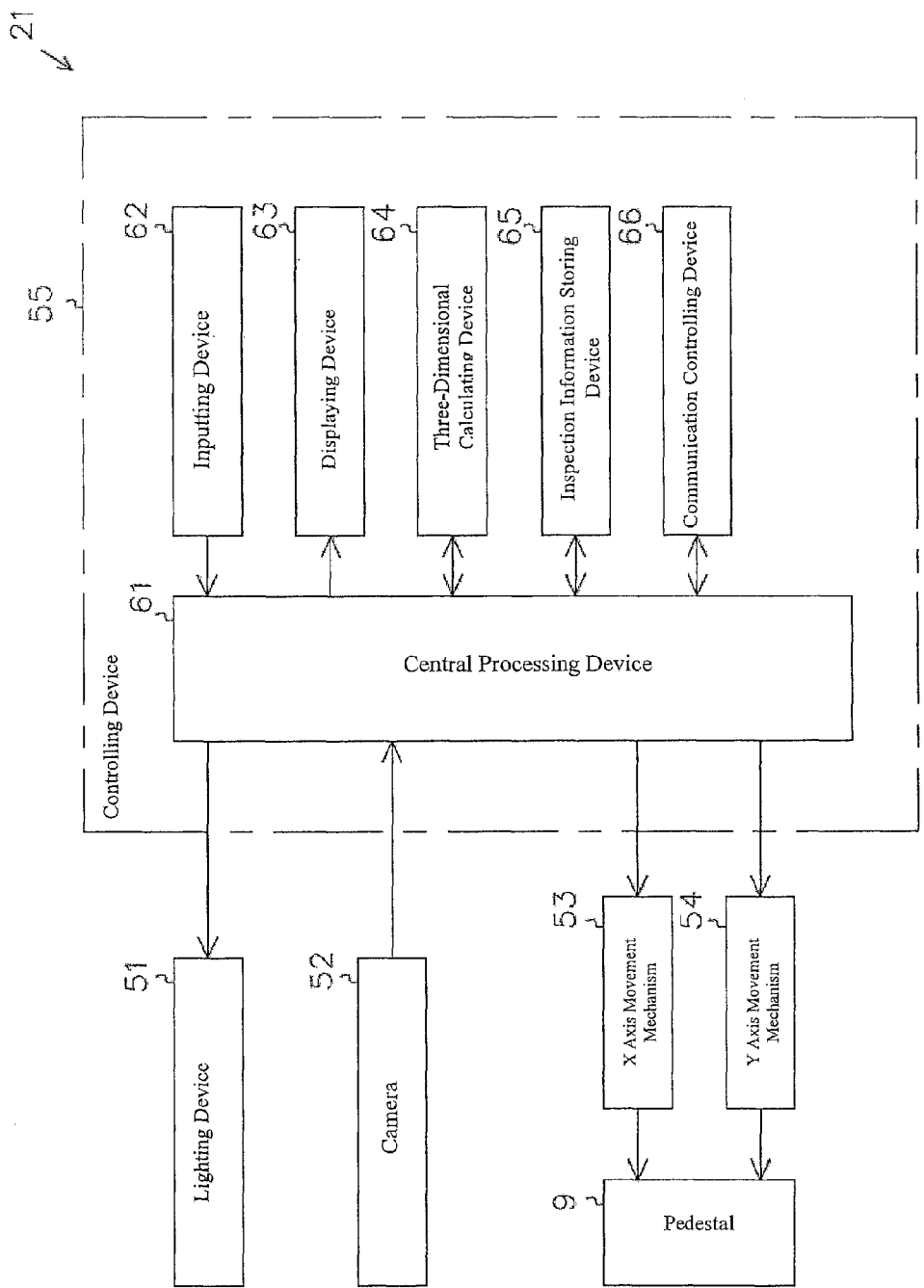
FIG. 3 is a structural diagram illustrating a schematic structure for a solder print inspecting device according to one or more embodiments of the present invention.

FIG. 1 is a structural diagram illustrating a schematic structure of an inspecting device monitoring system 100. FIG. 2 is a structural diagram illustrating a schematic structure for a printed substrate production line 10. FIG. 3 is a structural diagram illustrating a schematic structure of a solder print inspecting device 21 that is the subject of monitoring of the monitoring system 100.

Prior to explaining the monitoring system 100, the printed substrate production line 10 will be explained first.

As illustrated in FIG. 2, the production line 10 is provided with a cream solder printing machine 11, a component mounting machine 12, and a reflow machine 13, provided sequentially from the starting side (the left side in FIG. 2).

The cream solder printing machine 11 is a machine for printing a specific amount of cream solder 3 onto a land (pad) 2 that is provided on a printed substrate 1. (See FIG. 8(a), etc.) The printed substrate 1 corresponds to an inspection object in the present embodiment.

The component mounting machine 12 is a machine for placing electronic components, such as chips, onto the cream solder 3 that has been printed.

The reflow machine 13 is a machine for heating and melting the cream solder 3, to solder bond (solder) the lands 2 and the electrodes or leads of the electronic components together.

Note that the fundamental structures of these machines 11 through 13 are well-known, so detailed explanations thereof will be omitted.

A solder print inspecting device 21, for inspecting the state of the printed cream solder 3 (for example, the printing position, height, volume, etc.) is provided on the downstream side of the cream solder printing machine 11. A branching device 31 is provided between the solder print inspecting device 21 and the component mounting machine 12. Given this, a printed substrate 1 that has been evaluated as a non-defective product by the solder print inspecting device 21 is guided to the component mounting machine 12 on the downstream side, but a printed substrate 1 that has been evaluated to be a defective product is rejected to a defective product storing portion 41. Thus, the rejecting unit in the present embodiments are structured from the branching device 31.

A mounting status inspecting device 22, for inspecting the status of the mounted electronic components, is provided on the downstream side of the component mounting machine 12. A branching device 32 is provided between the mounting status inspecting device 22 and the reflow machine 13. Given this, a printed substrate 1 that has been evaluated as a non-defective product by the mounting status inspecting device 22 is guided to the reflow machine 13 on the downstream side, but a printed substrate 1 that has been evaluated to be a defective product is rejected to a defective product storing portion 42.

A soldering status inspecting device 23, for inspecting whether or not the status of soldering after reflow is appropriate, and an electrical conductivity inspecting device 24, for inspecting whether or not appropriate electrical conductivity has been secured after soldering, are provided on the downstream side of the reflow machine 13. Branching devices 33 and 34 are provided on the respective downstream sides of these individual inspecting devices 23 and 24. Given this, a printed substrate 1 that has been evaluated as a non-defective product by the inspecting devices 23 and 24 is guided to the non-defective product unloading portion 14 on the downstream side, but a printed substrate 1 that has been evaluated to be a defective product is guided to a defective product storing portion 43 or 44.

Moreover, a production line 10 is provided with conveyors 25, and the like, as a conveying unit for moving the printed substrates 1 between the various machines.

The structure of the solder print inspecting device 21, which is monitored by the monitoring system 100, will be explained in detail next. As illustrated in FIG. 3, the solder print inspecting device 21 comprises a pedestal 9, upon which the printed substrate 1 is placed, a lighting device 51, as a "lighting unit," for lighting the surface of the printed substrate 1 with a specific light component pattern from an upward oblique, a camera 52, as a "imaging unit," for capturing an image of the printed substrate 1 that is illuminated with the light component pattern, and a controlling device 55 for executing the various types of control, image processing, and calculation processing within the solder print inspecting device 21.

Moreover, the solder print inspecting device 21 is provided with an X axis moving mechanism 53 and a Y axis moving mechanism 54, for moving the pedestal 9. The pedestal 9, on which the printed substrate 1 is placed, is slid in the X-axial direction and the Y-axial direction through operation of the X axis moving mechanism 53 and the Y axis moving mechanism 54. This enables the printed substrate 1 to be moved in an arbitrary direction (the X-axial direction and Y-axial direction).

As a conveying unit for conveying the printed substrate 1, the pedestal 9 is provided with, for example, a pair of conveyor belts for conveying the printed substrate 1 in a specific direction while supporting both sides of the printed substrate 1, a pair of rails for supporting the individual conveyor belts so as to be able to rotate, a motor for driving the conveyor belts, and the like.

Given the structure set forth above, a printed substrate 1 that is conveyed from the upstream side into the solder print inspecting device 21, and guided onto the pedestal 9, is guided to a specific location by the rotation of the conveyor belt, and then is pressed by a chuck, or the like, to be positioned at a specific position on the pedestal 9. Given this, after the inspection, the pressure by the chuck, or the like, is released, and the printed substrate 1 is conveyed out from the solder print inspecting device 21, toward the downstream side, through the rotation of the conveyor belts.

Obviously, the structure of the pedestal 9 is not limited to the form set forth above, but instead may use a different structure.

The controlling device 55 comprises: a central processing device 61 that administers the overall control of the solder print inspecting device 21; an inputting device 62 that is structured from a keyboard, mouse, touch panel, or the like; a displaying device 63, having a display screen such as a CRT or a liquid crystal; a three-dimensional calculating device 64 for performing three-dimensional measurements of the cream solder 3 based on image data, or the like, captured by the camera 52; an inspection information storing device 65 for storing inspection information such as the image data that is obtained, the results of the three-dimensional measurements, and the like; and a communication controlling device (communication interface) 66, as a communicating unit, for performing control of communication such as controlling transmission and reception of various types of information.

The central processing device 61 is a computer that is provided with a CPU, a ROM, a RAM, an I/O, a free-run counter, and the like, and the individual devices 62 through 66, set forth above, are connected electrically to the central processing device 61.

The state of inspection by the solder print inspecting device 21 will be explained in detail next. When a printed substrate 1 is placed in a specific location in the solder print inspecting device 21, a specific part of the printed substrate 1 is illuminated with the light component pattern from the lighting device 51, and a specific part of the printed substrate 1, illuminated with the light component pattern, is imaged by the camera 52, based on an instruction from the central processing device 61.

The imaging is performed by inspection area units that have been set in the printed substrate 1. Given this, the entirety of the printed substrate 1 can be imaged by the printed substrate 1 being moved sequentially by the moving mechanisms 53 and 54, described above.

The image data that is captured by the camera 52 is converted into a digital signal within the camera 52, and inputted into the central processing device 61 in the form of a digital signal, to be stored in the inspection information storing device 65.

Given this, a three-dimensional measurement is performed by the three-dimensional calculating device 64 based on the image data stored in the inspection information storing device 65. That is, the inspecting units in the present embodiments are structured from the central processing device 61, the lighting device 51, the camera 52, the three-dimensional calculating device 64, and so forth.

In the present embodiment, the height (the peak height and average height), volume value, three-dimensional shape, and the like, of the cream solder 3 that is printed on the printed substrate 1 are measured. Note that while, in the present embodiment, a phase-shift method is used when performing the three-dimensional measurements, an arbitrary measuring method, such as the light-blocking method, the space code method, the focusing method, or the like, may be used instead.

The measurement results are stored in the inspection information storing device 65, and a defective/non-defective-product evaluation is performed by the central processing device 61 based on the measurement results. That is, the evaluating units in the present embodiments are structured from the central processing device 61.

More specifically, the central processing device 61 compares the measurement result, stored in the inspection information storing device 65, to reference data that is stored in advance, to perform a defective/non-defective-product evaluation for the state of printing of the cream solder 3 for each land 2 on the printed substrate 1 (including solder bridges formed between a plurality of lands, etc.).

In the present embodiment, whether or not "protrusions (peak heights)" are within a reference range, whether or not there is "blurring," whether or not the "footprint (area)," is within the reference range, whether or not the "volume," is within the reference range, whether or not the "average height" is within the reference range, whether or not the "misalignment" in the X-axial direction is within the reference range, whether or not the "misalignment" in the Y-axial direction is within the reference range, and whether or not there is a "non-soldered" state wherein the cream solder 3 is not present, are set as the inspection items. Of course, the inspection items are not limited to these, and may be set arbitrarily.

The central processing device 61 performs a "non-defective-product evaluation (Okay)" or "defective-product evaluation (NG)" for each inspection item for each individual land 2. Given this, if there are is a non-defective-product evaluation for the state of printing of the cream solder 3 for all of the lands 2 on the printed substrate 1, then there is a "non-defective-product evaluation (Okay)" for the printed substrate 1. On the other hand, if there is even a single "defective-product evaluation (NG)" in any of the individual defective/non-defective-product evaluations (the defective/non-defective-product evaluations for each of the individual inspection items for each of the individual lands 2), then there will be a "defective-product evaluation (NG)" for the printed substrate 1 as a whole.

Thereafter, the central processing device 61 stores the evaluation results for the printed substrate 1 (including the evaluation results for each individual inspection item for each individual land 2) for the printed substrate 1 for which the defective/non-defective-product evaluation was performed, together with the image data and measurement results, and the like, for the printed substrate 1, into the inspection information storing device 65. At the same time, the central processing device 61 performs a process for updating the production control information for ascertaining the state of production itself.

For example, when there has been a non-defective-product evaluation, the central processing device 61 increments by one the non-defective product count number that is stored in the local memory, or the like and also updates the value of the operating status flag, for evaluating the local operating status to "0," which indicates "production in process."

On the other hand, if there is a defective-product evaluation, then the central processing device 61 increments by 1 the value of the defective product count number, stored in the local memory, or the like, and also changes the value of the operating status flag to "1," which indicates a "temporary stop."

Following this, the central processing device 61 references the operating status flag, and if the value thereof is a "1," which indicates a "temporary stop," temporarily stops the operation by the pedestal 9 that would convey the printed substrate 1 out, to place the solder print inspecting device 21 in a temporarily stopped state. This function structures the temporary stopping unit in the present embodiment. Along with this, notification may be provided that a defective product has been produced, doing so by, for example, illuminating a tower light 67, described below.

Note that while details will be provided below, if there has been a defective-product evaluation through the defective/non-defective-product evaluation, the central processing device 61, after performing a process to update the production control information, described above, sends, to a mobile terminal 200, described below, the production control information that has been updated (such as temporary stop information), through the communication controlling device 66. This makes it possible to provide notification promptly to the operator, to the mobile terminal 200, that the solder print inspecting device 21 is stopped temporarily (indicating that there has been a defective product), without waiting for a request for transmission of production control information, from the mobile terminal 200, such as is done otherwise.

The monitoring system 100 will be explained in detail next. A plurality of the aforementioned production lines 10 is installed in a factory that is controlled by the monitoring system 100, and an aforementioned solder print inspecting device 21 is installed in each production line 10.

In the present embodiment, first through sixth production lines 10 are provided, in a structure wherein a total of six solder print inspecting devices 21, No. 1 through No. 6, are monitored by the monitoring system 100. Of course, the number of solder print inspecting devices 21 (the number of the production lines 10) that are subject to monitoring by the monitoring system 100 is not limited thereto. For example, structure may be one wherein only a single solder print inspecting device 21 (a single production line 10) is monitored.

As illustrated in FIG. 1, each individual solder print inspecting device 21, in addition to the structure set forth above, is provided with a tower light 67. The tower light 67 provides notification through a blinking light, a buzzer alarm, or the like, when some sort of problem occurs, such as when there is a defective-product evaluation, as described above.

Moreover, the tower light 67 in the present embodiments has a function as an access point (an antenna device) for sending and receiving radio signals between the communication controlling device 66, described above, and a mobile terminal 200, described below, and between a plurality of mobile terminals 200.

Moreover, the tower light 67 in the present embodiments is structured independently from the main unit of the solder print inspecting device 21, structured so as to be attached to the solder print inspecting device 21 after the fact, and so as to enable an electrical connection. Doing so makes it easy to implement the monitoring system 100 in existing production lines 10.

The communication controlling device 66 and tower light 67 of each individual solder print inspecting device 21 is connected to a hub 150 through a respective LAN (Local Area Network) cable, to thereby structure a wired LAN.

Furthermore, a wireless LAN, for performing wireless communication, is structured between the tower lights 67 and the mobile terminals 200. Consequently, the on-site LAN within the factory is structured from these wired LANs and wireless LANs, where the communications circuit in the present embodiments is structured from this on-site LAN.

The communication controlling device 66 has a function for sending, through the tower lights 67, various types of information, outputted from the central processing device 61, to the individual mobile terminals 200, or for inputting various types of information, received from the individual mobile terminals 200, into the central processing device 61.

Note that the scope over which the tower light 67 of each individual solder print inspecting device 21 can exchange radio signals with mobile terminals 200 is limited to a specific surrounding area and, thus, if there is no mobile terminal 200 that is subject to transmission and reception within the area of the tower light 67 of a given solder print inspecting device 21, then the exchange of data will be through the tower light 67 of another solder print inspecting device 21 that has an area wherein it is possible to communicate with the applicable mobile terminal 200.

Moreover, as described above, the tower light 67 has a function for relaying the exchange of data between a plurality of mobile terminals 200. For example, if data is to be transmitted from a mobile terminal 200A of an Operator A to a mobile terminal 200B of an Operator B, then the route would be the mobile terminal 200A of the Operator A→first tower light 67→hub 150→second tower light 67→mobile terminal 200B of the Operator B.

The mobile terminal 200 will be explained next. In the present embodiment, an existing smart phone, tablet PC, or the like, is used as the mobile terminal 200.

Consequently, although omitted from the drawings, the mobile terminal 200 is provided with a controlling portion structured from a CPU, or the like, that performs various types of calculation processes, memory made from a ROM for storing programs, and the like, and a RAM for storing various types of data temporarily, and so forth, along with a communication processing portion, as a communicating unit, for exchanging various types of data through the tower lights 67, and so forth.

Moreover, mobile terminal 200 is provided with a displaying portion 201, able to display various types of information. The displaying portion 201 is structured from a so-called "touch panel," to a structure displaying unit and an inputting unit.

The states of operation of the monitoring system 100, structured as described above, will be explained in detail below.

The central processing device 61 of each individual solder print inspecting device 21 within the factory periodically (which, in the present embodiment, is each time the inspection of a single printed substrate 1 has been completed) ascertains the local production status and updates and records, in its local memory, or the like, information pertaining thereto, as production control information, as described above.

In the present embodiment, a "production count (non-defective product count number)" that indicates the number of non-defective printed substrates 1, an "NG count (defective-product count number)" that indicates the number of defective products produced, an operating status flag value for evaluating the local operating status (either "production in process (running)" or "temporary stop"), and so forth, are stored as production control information.

On the other hand, a plurality of operators is employed for monitoring the production lines 10 within the factory (a production floor wherein the production lines 10 are placed, a monitoring office wherein the operators are standing by, or the like), where each individual operator possesses one mobile terminal 200 each.

Additionally, when an operator launches software (an application) that is installed in advance in the mobile terminal 200, then a specific menu screen (not shown) is displayed on the displaying portion 201 of the mobile terminal 200.

Figure 4:
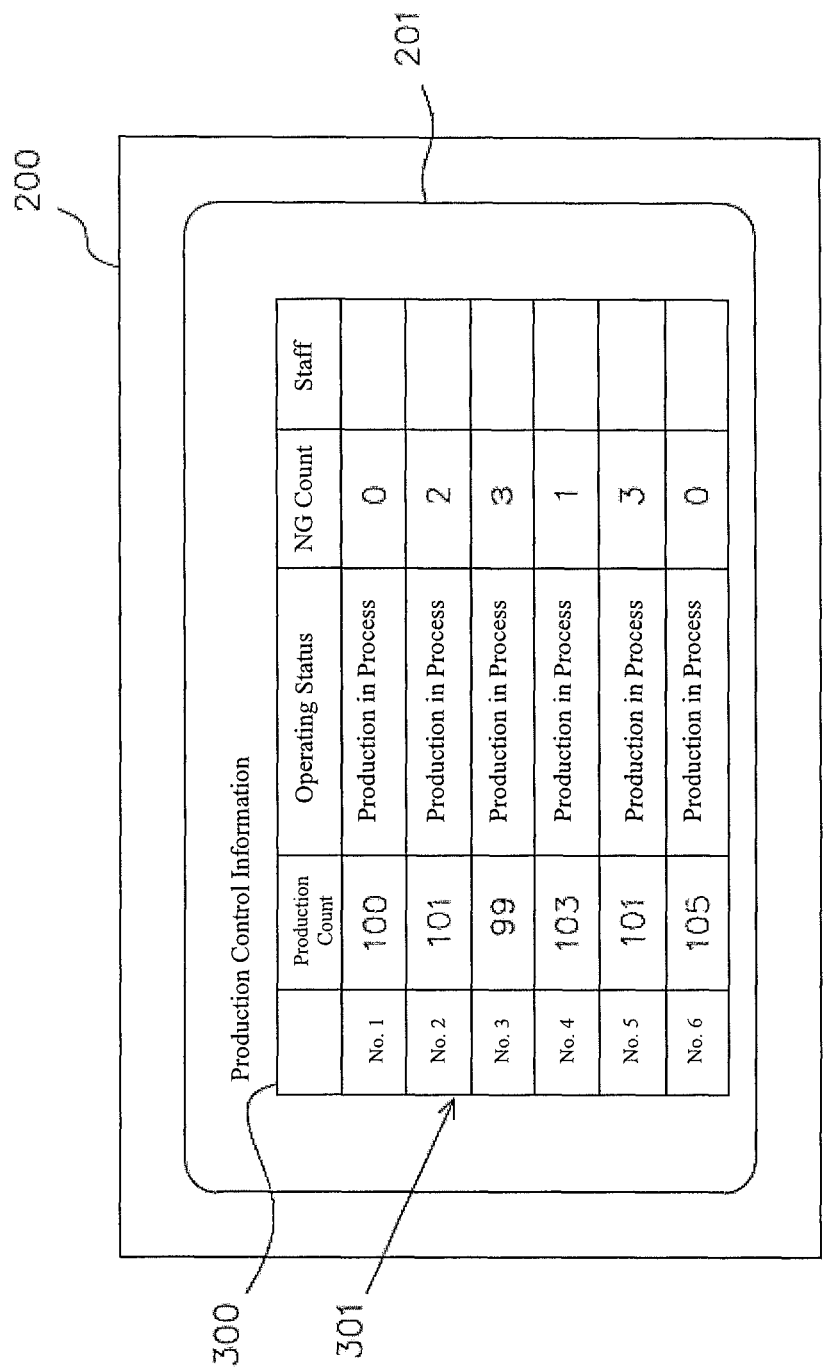
FIG. 4 is a schematic diagram illustrating one example of the state of a display on a displaying portion of a mobile terminal according to one or more embodiments of the present invention.

Following this, when the operator pushes the "Production Control" button that is displayed on the menu screen, then the "Production Control" screen, such as shown in FIG. 4, is displayed. Note that here a "button" unit an image that has the pattern of a button, displayed on the displaying portion 201 (both here and below).

When the "Production Control" button is pressed, then the mobile terminal 200 sends a data request signal, requesting production control information, to the central processing device 61 of each individual solder print inspecting device 21 through the aforementioned on-site LAN. The central processing device 61 of each individual solder print inspecting device 21 that receives this signal returns the aforementioned production control information to the mobile terminal 200 that was the transmission source that sent the request signal.

On the other hand, the mobile terminal 200 that has received the production control information from each of the solder print inspecting devices 21 stores the production control information in memory. Consequently, the production control information regarding six individual solder print inspecting devices 21 is stored in each mobile terminal 200.

Thereafter, the mobile terminal 200, in a background process, sends the data request signal to each of the solder print inspecting devices 21 at specific intervals (for example, at 30-second intervals), to receive new production control information, which is stored in memory. Doing so causes the production control information in the memory of the mobile terminal 200 to be updated to the newest data with each specific time interval.

Note that when the value of the operating status flag is "1," indicating a "temporary stop," that is, when a defective product has been produced, the central processing device 61 sends, along with the production control information, the evaluation result for the printed substrate 1 that has had the defective-product evaluation (including the evaluation results for each individual inspection item for each individual land 2), and the image data and measurement results, and the like, for the applicable printed substrate 1, to the mobile terminal 200.

Given this, an operating status table 300 is displayed on the "Production Control" screen of the mobile terminal 200, based on the production control information described above. Six display fields 301, corresponding to the first through sixth solder print inspecting devices 21, are established in the operating status table 300.

Each individual display field 301, corresponding to an individual solder print inspecting device 21, displays, for example, the "machine number" of the solder print inspecting device 21, the "production count" of the printed substrate 1, the "operating status" of the solder print inspecting device 21, the "NG count" for the printed substrate 1, the "operator name (staff)" of the operator who will handle the checking task, described below, and so forth, based on the aforementioned production control information.

Moreover, for the "operator name," the name of an operator that has been registered in advance (the current operator), associated with unique information (an ID, a MAC address, or the like) of the mobile terminal 200, is displayed. Displaying, in the operating status table 300, the name of the operator who will take responsibility, makes it possible for each operator to ascertain the tasks that are being handled by the other operators, thereby making it easier to select what tasks one should handle oneself, and, thus, enabling an improvement in convenience in operations.

Note that because even given the same mobile terminal 200, the operator that uses that terminal may be different with each work shift; there is the risk that it may not be possible to specify an individual who will actually perform a task, through merely displaying the identification information of the mobile terminal 200. In response, it is possible to ascertain more reliably the operators who were handling the individual tasks through displaying the operator name in the display field 301, as in the present embodiment.

The operating state of the monitoring system 100 when a printed substrate 1 for which there has been a defective-product evaluation has been produced, and the operating sequence and display statuses of the mobile terminal 200, will be explained in detail below, referencing the figures, for a specific solder print inspecting device 21.

Note that in FIG. 6 through FIG. 9, a case wherein the solder print inspecting device 21 "No. 3" is temporarily stopped will be presented as a specific case, and in each, the mobile terminal 200A possessed by the Operator A is shown in (a), and the mobile terminal 200B, possessed by the operator B, is shown in (b).

Figure 5:
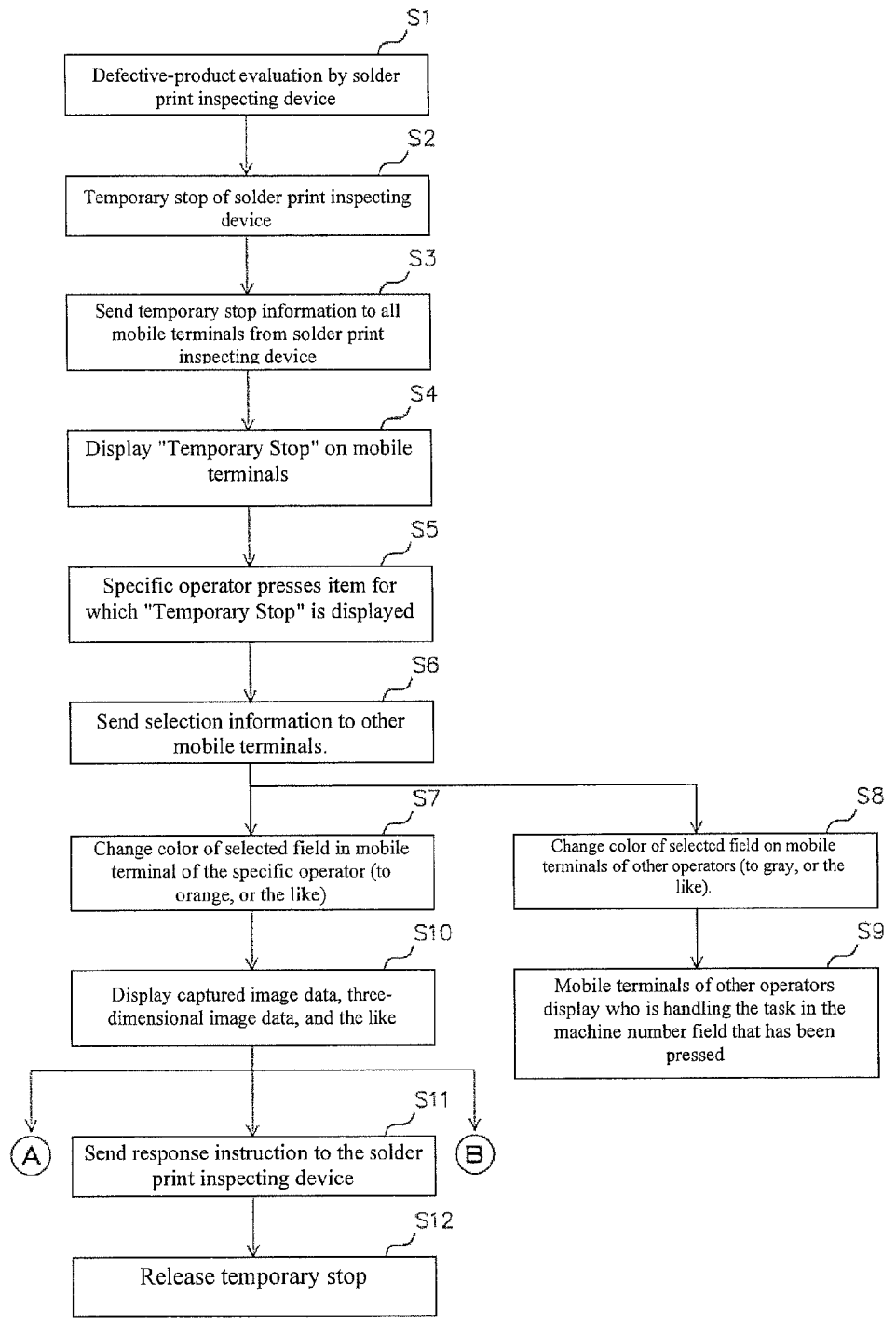
FIG. 5 is a flowchart for explaining the flow regarding processing operations when a defective product has been produced.

As illustrated in the flow chart in FIG. 5, when there is a defective-product evaluation for a specific printed substrate 1 (Step S1) in the specific solder print inspecting device 21 ("No. 3" in the example in FIG. 6), the value of the aforementioned operating status flag is updated to "1," indicating a "temporary stop," and the solder print inspecting device 21 is stopped temporarily (Step S2). Specifically, the conveying operation by the pedestal 9 for the printed substrates 1 is stopped, and the operation for conveying in a new printed substrate 1, and the inspection operation, are temporarily stopped.

Following this, the solder print inspecting device 21 sends, to the mobile terminals 200 of all of the operators (including the mobile terminals 200A and 200B of Operators A and B) information indicating that there is a temporary stop (temporary stop information), the evaluation result regarding the printed substrate 1 for which there was the defective-product evaluation (including the evaluation result for each individual inspection item for each individual land 2), and inspection information such as image data, measurement results, and the like, pertaining to the applicable printed substrate 1 (Step S3). The "temporary stop information" structures the "operating information" for the solder print inspecting device 21 in the present embodiment.

All of the mobile terminals 200, which have received this information, change the display status of the "Operating Status" item in the display field 301 corresponding to the solder print inspecting device 21 that is temporarily stopped, in the local operating status table 300, to display "Temporary Stop" (Step S4). This makes it possible for the operator to ascertain that "a status has occurred requiring a specific check task by an operator." That is, the "Operating Status" in the display field 301 that displays "Temporary Stop" structures a "task item" in the present embodiment.

Figure 6:
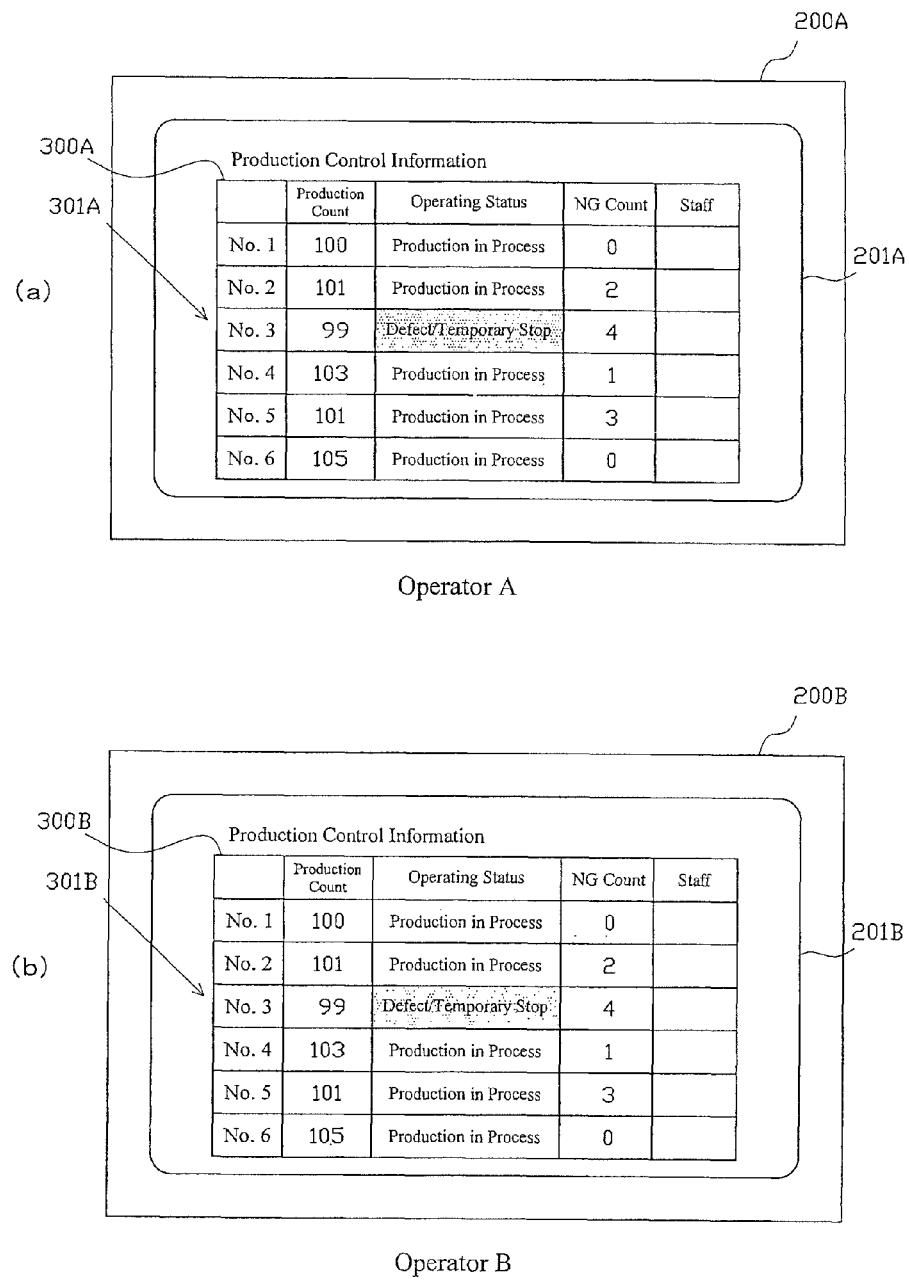
FIGS. 6 (a) and 6(b) are schematic diagrams illustrating one example of the state of a display on a plurality of mobile terminals in the flow regarding the processing operations when a defective product has been produced.

As a specific example, in the operating status tables 300A and 300B that are displayed on the displaying portions 201A and 201B of the mobile terminals 200A and 200B of the Operators A and B, "Defective Product/Temporary Stop" is displayed in the "Operating Status" item of the display fields 301A and 301B for the No. 3 solder print inspecting device 21, and the color for this "Operating Status" item is changed from the default color (for example, white) to a specific color (for example, yellow) that indicates "Temporary Stop." (See FIGS. 6 (a) and (b).)

Following this, a specific operator presses the display field 301 (the "Operating Status" item) that is displayed as "Defective Product/Temporary Stop," to select the checking task for that display field 301 as a task that that operator will handle himself/herself (Step S5). When the display field 301 is pressed, then the mobile terminal 200 sends through the on-site LAN to the mobile terminals 200 of all of the other operators selection information indicating that that particular operator has selected the check task pertaining to that display field 301 (Step S6).

Figure 7:
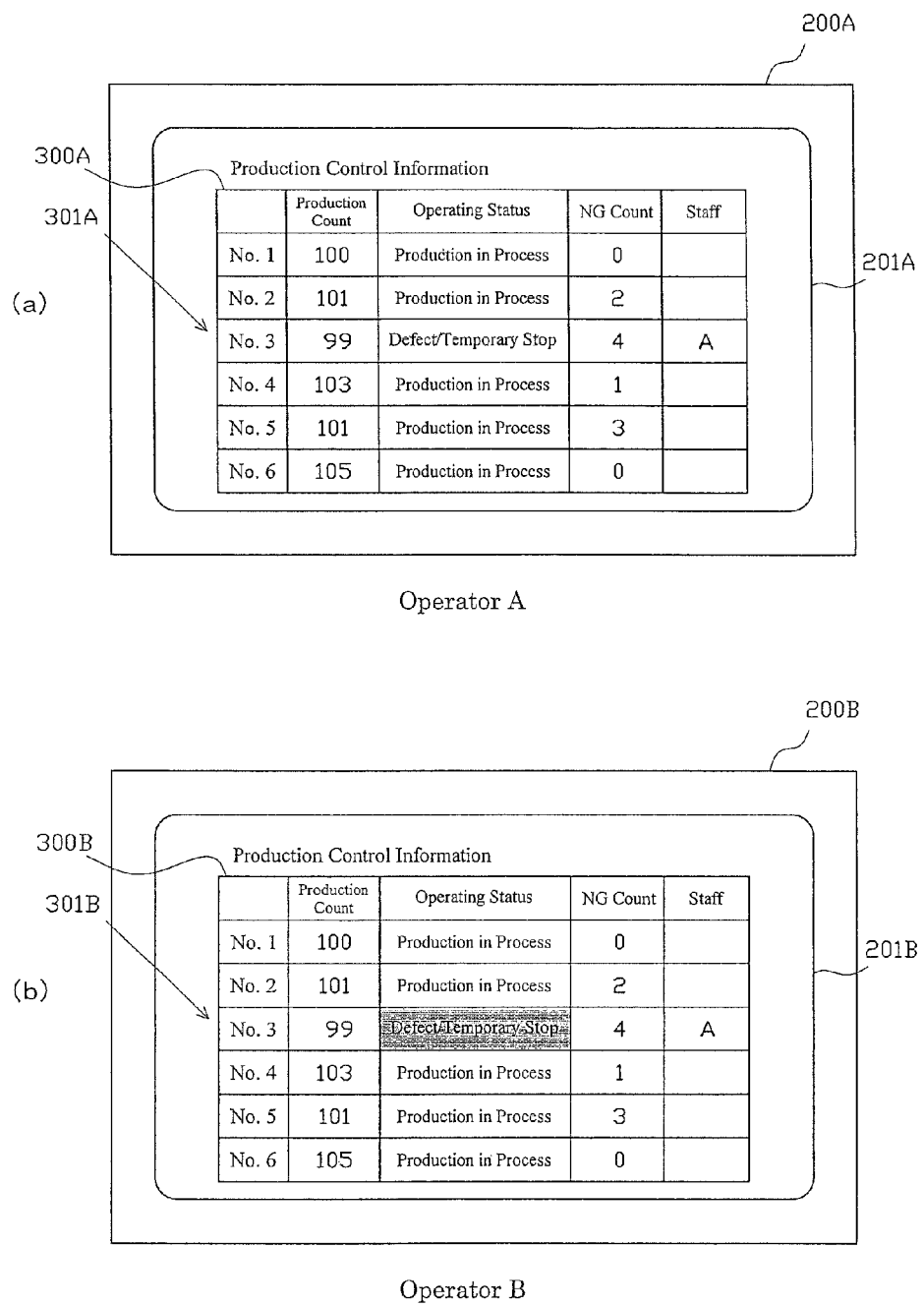
FIGS. 7 (a) and 7(b) are schematic diagrams illustrating one example of the state of a display on a plurality of mobile terminals in the flow regarding the processing operations when a defective product has been produced.

Specifically, when, for example, an Operator A makes a selection by pressing the "Operating Status" item for the display field 301A pertaining to the No. 3 solder print inspecting device 21 for which "Defective Product/Temporary Stop" is displayed, in the operating status table 300A, the "Operating Status" item that has been selected changes from the aforementioned specific color (for example, yellow) to a particular color that indicates "Being Serviced" (for example, orange) (Step S7), and also the name of the Operator A is displayed in the "Staff" item in the display field 301A (referencing FIG. 7 (a)).

On the other hand, the mobile terminals 200 for the others, which have received the selection information, change the "Operating Status" item in the display field 301 that has been selected by the mobile terminal 200 that is the transmission origin that sent the selection information, in the local operating status table 300, to indicate that it has been selected by the specific operator.

Specifically, if, for example, the mobile terminal 200B of the Operator B has received selection information from the mobile terminal 200A of the Operator A, then, in its own operating status table 300B, the "Operating Status" item for the display field 301B corresponding to the display field 301A that has been selected by Operator A is grayed out (Step S8), and the name of the Operator A is displayed in the "Staff" item of the display field 301A (Step S9, referencing FIG. 7 (b)). This makes it possible for Operator B to ascertain that Operator A has selected the task relating to the display field 301B.

Figure 12:
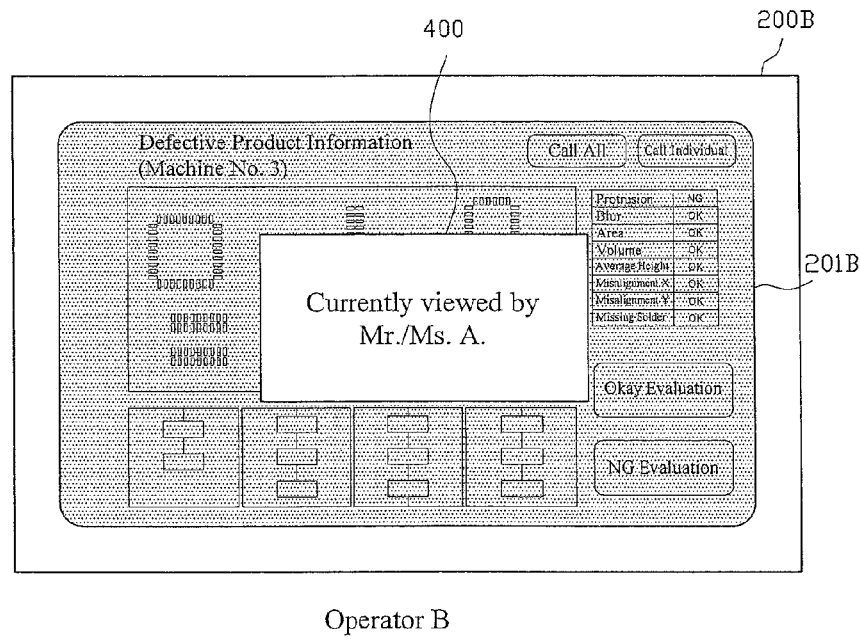
FIG. 12 is a schematic diagram illustrating one example of the state of a display on a mobile terminal in the flow regarding the processing operations when a defective product has been produced.

Note that, in the present embodiment, if the "Operating Status" item of the display field 301B is grayed out, then the Operator B is prevented from selecting the display field 301B. If here the Operator B were to press the display field 301B, then, if it is selected, the displaying portion 201B of the mobile terminal 200B would switch to a "Defective Product Information" screen, but a pop-up display 400 referencing Operator A would be displayed thereover so as to prevent execution of the checking task related to the display field 301. (See FIG. 12.)

Moreover, in the mobile terminal 200 of the specific operator that has selected the checking task pertaining to the display field 301 that is displayed as "Defective Product/Temporary Stop" as a task that that operator will handle himself/herself, the selected "Operating Status" item will change to a specific color, described above (such as, for example, orange), and, after a brief time (for example, after three seconds), the displaying portion 201 of the mobile terminal 200 will switch to the "Defective Product Information" screen.

Given this, the inspection information pertaining to the printed substrate 1 for which there was the defective-product evaluation, such as the two-dimensional image data captured by the camera 52, the three-dimensional image data for which three-dimensional measurements were performed, and the like, is displayed on the "Defective Product Information" screen of the displaying portion 201 (Step S10). This makes it possible for the operator to discern the specific detail for the printed substrate 1 for which there has been a defective-product evaluation.

Figure 8:
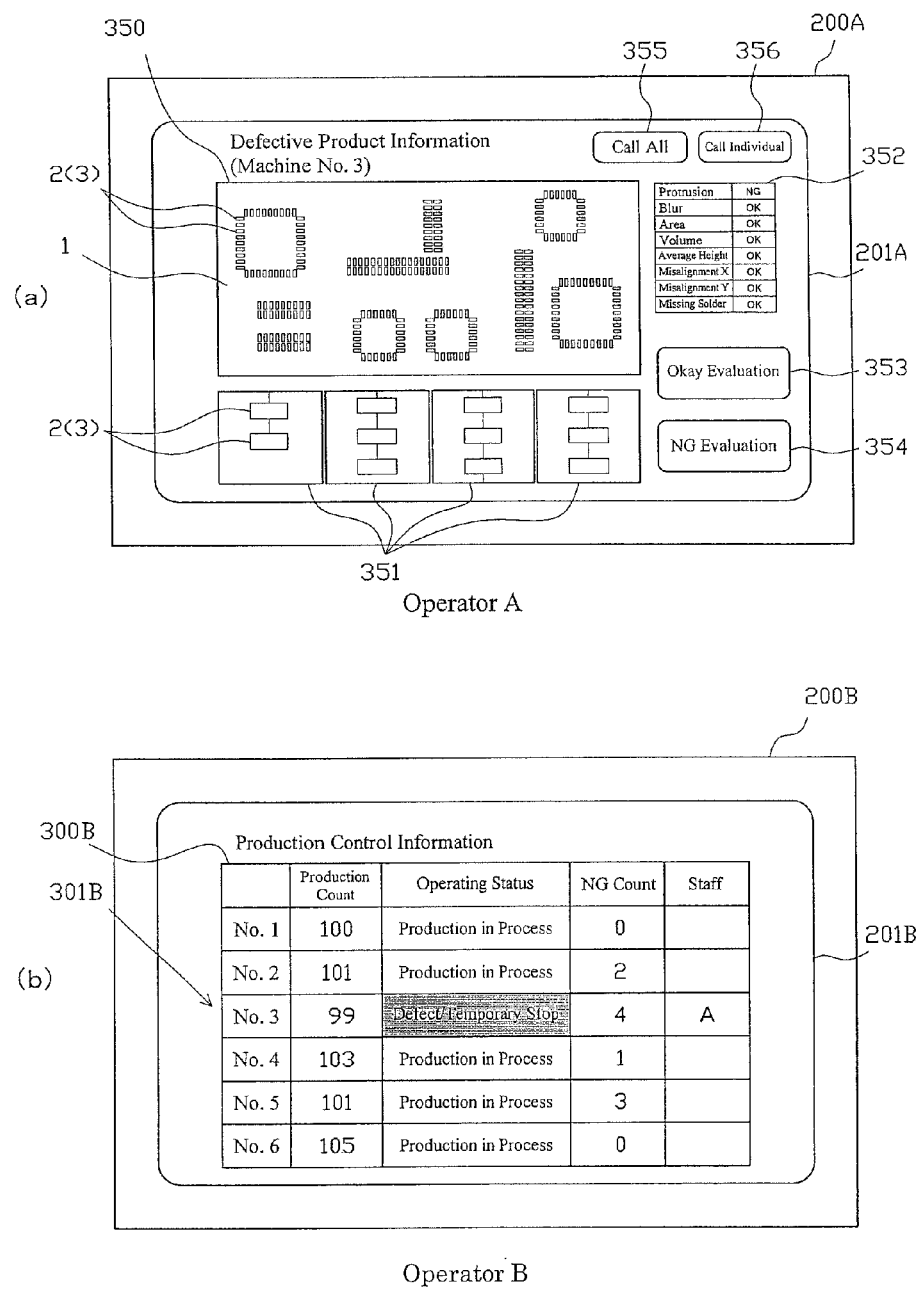
FIGS. 8 (a) and 8(b) are schematic diagrams illustrating one example of the state of a display on a plurality of mobile terminals in the flow regarding the processing operations when a defective product has been produced.

As a specific example, as illustrated in FIG. 8 (a), for example, a main display frame 350 wherein the entirety of the printed substrate 1 can be displayed, a plurality of sub-display frames 351 wherein enlargements of locations wherein defects have occurred can be displayed, and an infection item list 352 that can display the individual inspection items and the evaluation results thereof, are displayed on the "Defective Product Information" screen that is displayed on the displaying portion 201A of the mobile terminal 200A of the Operator A. In a sub-display frame 351, the structure is such that the screen can be touched to display three-dimensional image data regarding the cream solder 3 that is displayed in two dimensions.

With this structure, a specific operator, such as the Operator A that has received the authorization for the checking task for the printed substrate 1 for which there has been the defective-product evaluation, references the two-dimensional image data and three-dimensional image data, and the like, that is displayed on the "Defective Product Information" screen, to evaluate whether or not the evaluation result for the printed substrate 1 (the cream solder 3 printing status) for which there was a defective-product evaluation was correct.

Moreover, an "Okay Evaluation" button 353 and an "NG Evaluation" button 354, by which the operator can send a response instruction to the solder print inspecting device 21, are displayed in the "Defective Product Information" screen.

Given this, if the operator who is given the authorization, described above, evaluates that the defective-product evaluation for the printed substrate 1 by the solder print inspecting device 21 was correct, then the evaluation result by the solder print inspecting device 21 is to be confirmed, so the "NG Evaluation" button 354 is pushed.

When the "NG Evaluation" button 354 is pushed, then the mobile terminal 200 sends a confirmation signal (confirmation information) to the solder print inspecting device 21 that is temporarily stopped (Step S11), and the solder print inspecting device 21 that has received this not only releases the temporary stop of the action for conveying the printed substrate 1 out, by the pedestal 9 (Step S12), but also outputs a reject signal to the branching device 31 indicating that the printed substrate 1 is to be rejected. Doing so causes the printed substrate 1, for which there is the defective-product evaluation, to be rejected to the defective product storing portion 41.

Thereafter, the solder print inspecting device 21 changes the value of the operating status flag from "1," which indicates "temporarily stopped," to "0," which indicates "production in process," thereby returning to the normal status.

Moreover, when the "NG Evaluation" button 354 is pressed in the mobile terminal 200, then the status of the "NG Evaluation" button 354 changes to a "No Change" button (not shown), to provide notification to the operator that the task has been completed. Thereafter, the displaying portion 201 of the mobile terminal 200 returns from the "Defective-Product Information" screen to the "Production in Process" screen.

On the other hand, if it is determined that the defective-product evaluation result for the printed substrate 1 by the solder print inspecting device 21 was incorrect, then the "Okay Evaluation" button 353 is pressed to correct the evaluation result by the solder print inspecting device 21 to that of a non-defective product.

When the "Okay Evaluation" button 353 is pressed, the mobile terminal 200 sends a correction signal (correction information) to the solder print inspecting device 21 that is temporarily stopped (Step S11), and the solder print inspecting device 21 that receives this signal releases the temporary stop on the operation of the pedestal 9 for conveying the printed substrate 1 out (Step S12), and a procedure for changing the aforementioned manufacturing control information is performed. Specifically, 1 is subtracted from the value of the defective product count number and 1 is added to the value of the non-defective product count number. Thereafter, the solder print inspecting device 21 changes the value of the operating status flag from "1," which indicates "temporarily stopped," to "0," which indicates "production in process," thereby returning to the normal status.

Moreover, if the "Okay Evaluation" button 353 in the mobile terminal 200A of the Operator A, for example, is pressed, then the applicable "Okay Evaluation" button 353 changes to a "Change Completed" button 359, to indicate to the operator that the task has been completed. (See FIG. 9 (*a*).) Thereafter, the "Defective Product Information" screen on the displaying portion 201A of the mobile terminal 200A returns to the "Production Control" screen.

Figure 9:
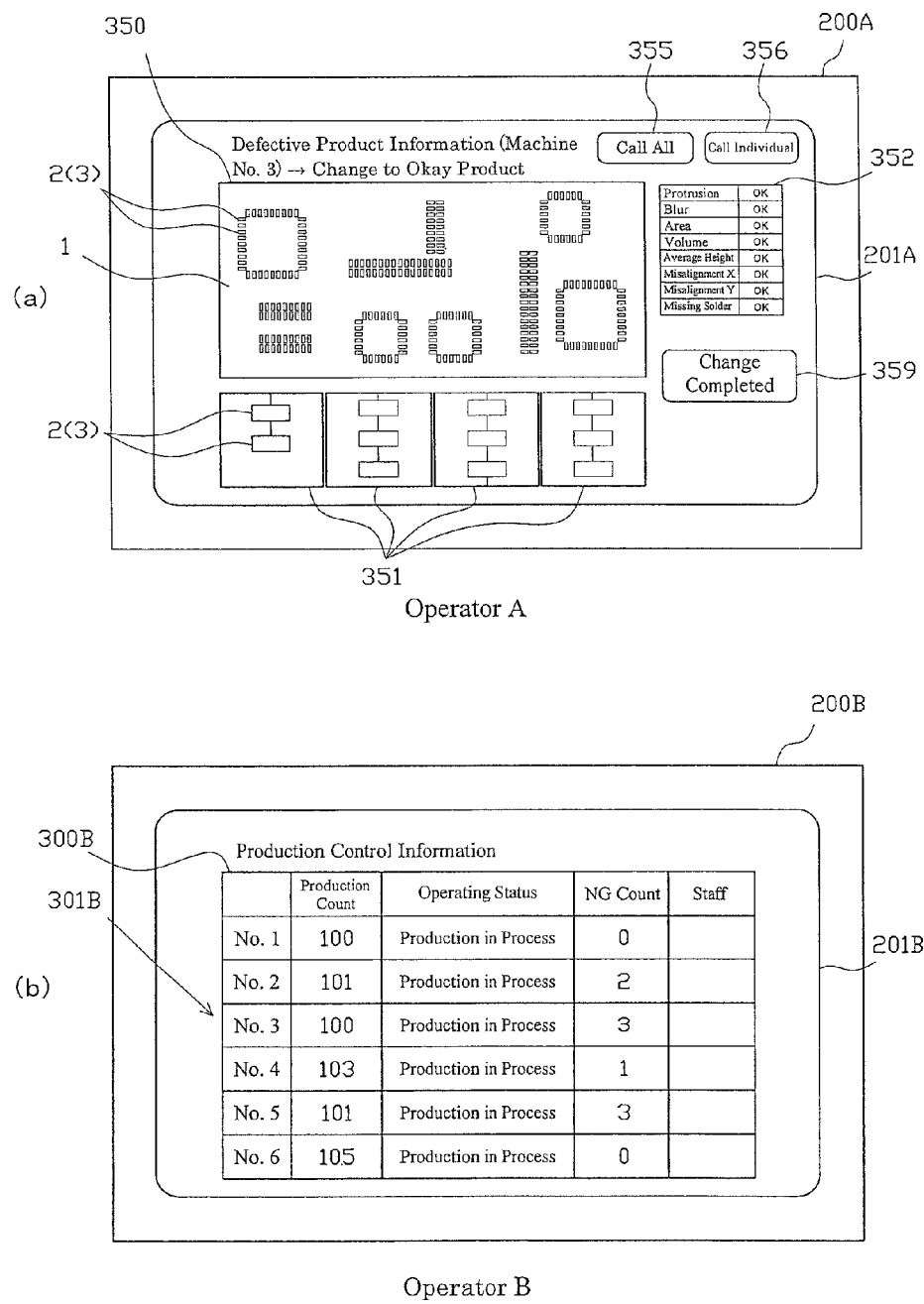
FIGS. 9(a) and 9(b) are schematic diagrams illustrating one example of the state of a display on a plurality of mobile terminals in the flow regarding the processing operations when a defective product has been produced.

During this time, on the mobile terminal 200B of the Operator B, the content that is displayed in the "Operating Status" item of the display field 301B, in the operating status table 300B that is displayed on the displaying portion 201B, for the No. 3 solder print inspecting device 21 returns to "Production in Process" from "Defective Product/Temporary Stop," and the color of the "Operating Status" item also returns to the default color (for example, white) from the particular color (for example, yellow) that indicates the "Temporary Stop." (See FIG. 9 (*b*).) This enables the individual Operator B to ascertain that the task pertaining to the display field 301 has been completed.

The operating procedure and display statuses for the mobile terminal 200 when an operator who has received the authorization for the checking task for the printed substrate 1 is incapable of performing the evaluation himself/herself from the detail that is displayed in the "Defective Product Information" screen in Step S10, above, will be explained in detail next, referencing the figures.

A "Call All" button 355 and a "Call Individual" button 356 for calling other operators are displayed in the "Defective Product Information" screen of the displaying portion 201 of the mobile terminal 200. The "Call All" button 355 is for sending a call to all operators, and the "Call Individual" button 356 is for sending a call to a specific operator.

The "Call All" button 355 and the "Call Individual" button 356, and the functions associated therewith, structure the authorization transferring unit in the present embodiment. In particular, the "Call All" button 355 and the functions associated therewith structure the non-specified transferring unit in the present embodiment, and the "Call Individual" button 356, and the functions associated therewith, structure the specified transferring unit.

Figure 10:
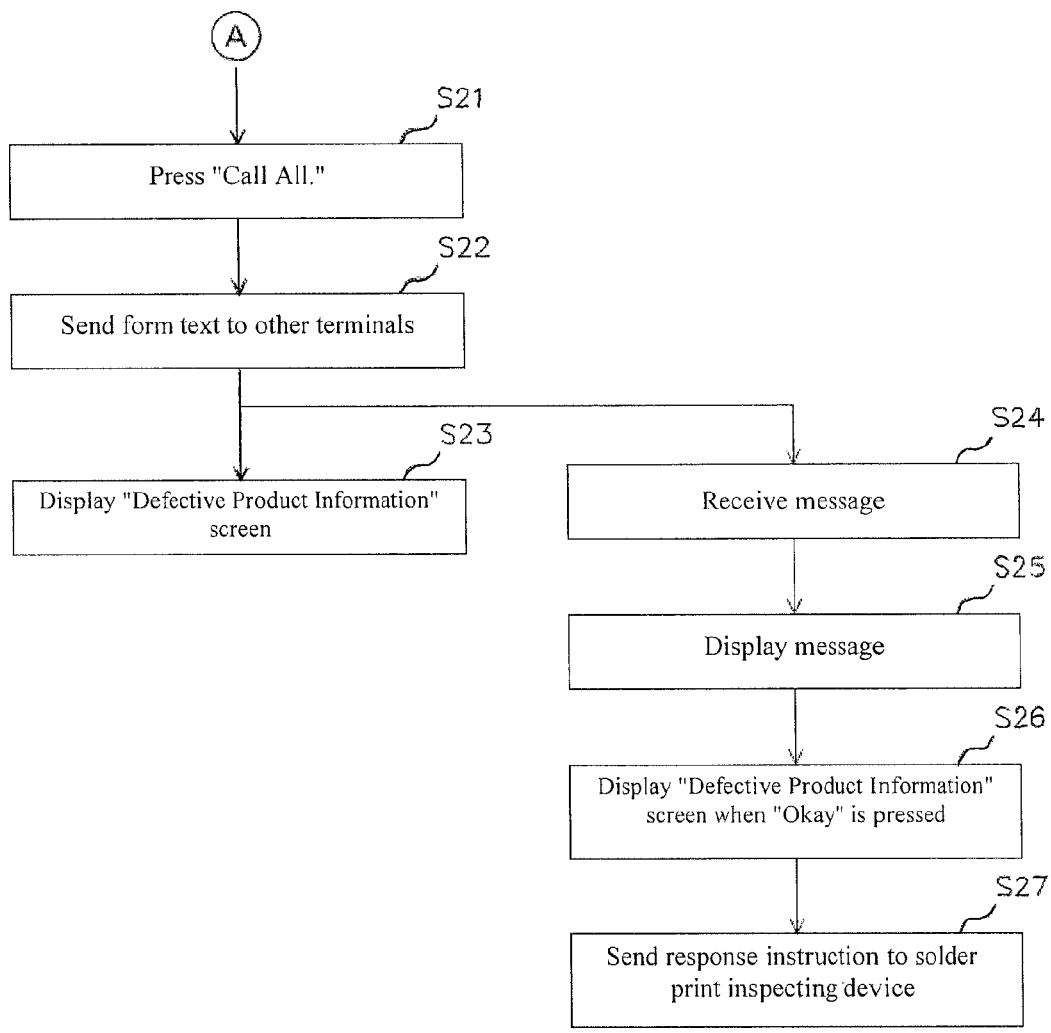
FIG. 10 is a flowchart for explaining the flow regarding processing operations when a defective product has been produced, and, in particular, regarding "call all."

The case wherein the "Call All" button 355 has been pressed will be explained first. As illustrated in FIG. 10, if a specific operator (for example, Operator A) presses the "Call All" button 355 on his or her mobile terminal 200 in Step S21, following Step S10, then a form letter message is sent to the mobile terminals 200 of all of the other operators (Step S22).

As the form letter, sentences such as, for example, "There is a follow-up message from Mr./Ms. A: Please check machine No. 3," are stored.

By sending this message, the specific operator loses the authorization for the checking task for the printed substrate 1 for which there has been a defective-product evaluation. However, the "Defective Product Information" screen continues to be displayed on the displaying portion 201 of the mobile terminal 200 of the specific operator (Step S23). However, the "Okay Evaluation" button 353 and the "NG Evaluation" button 354 are grayed out, causing them to be inoperable.

Figure 13:
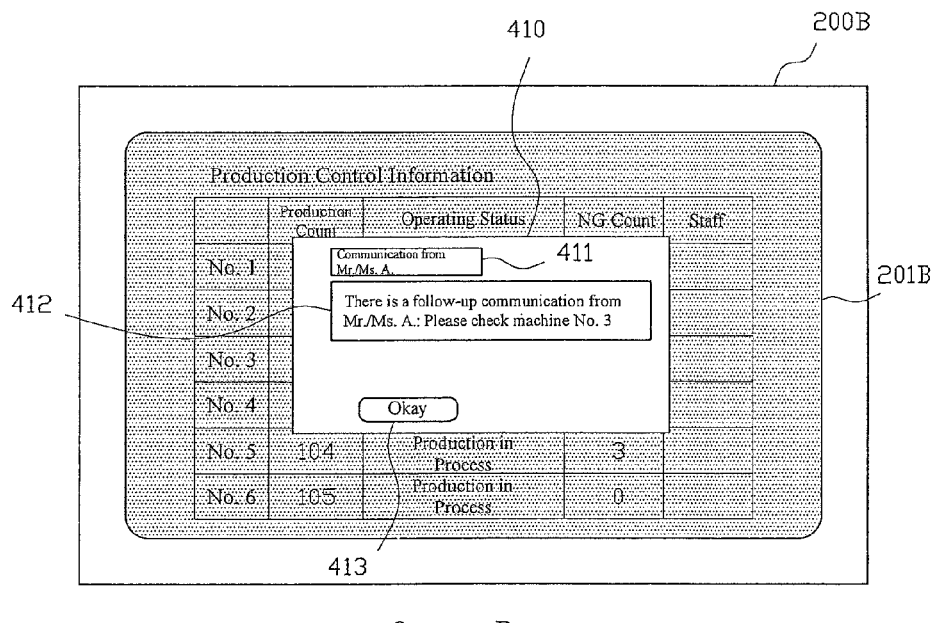
FIG. 13 is a schematic diagram illustrating one example of the state of a display on a mobile terminal in the flow regarding the processing operations when a defective product has been produced, and regarding, in particular, a call to all.

On the other hand, when the aforementioned message is received by the mobile terminal 200 of another operator (for example, Operator B) (Step S24), then a Message Received screen 410 (referencing FIG. 13) is displayed as a pop-up over the "Production Control" screen (Step S25).

The Message Received screen 410 is provided with a Sender field 411, a Message field 412, and an "Okay" button 413. If the "Okay" button 413 is pressed here, then the "Defective Product Information" screen will be displayed on the displaying portion 201 of the mobile terminal 200 of the operator who pushed the "Okay" button 413 (Step S26).

Given this, the operator (for example, an Operator C) that has received the authorization in this way references the image data, and the like, displayed in the "Defective Product Information" screen, following the same procedure set forth above, to evaluate whether or not the evaluation result for the printed substrate 1 (the printed state of the cream solder 3) for which there is the defective-product evaluation is correct, and presses the "Okay Evaluation" button 353 or the "NG Evaluation" button 354, to send a response instruction to the solder print inspecting device 21 (Step S27).

Figure 11:
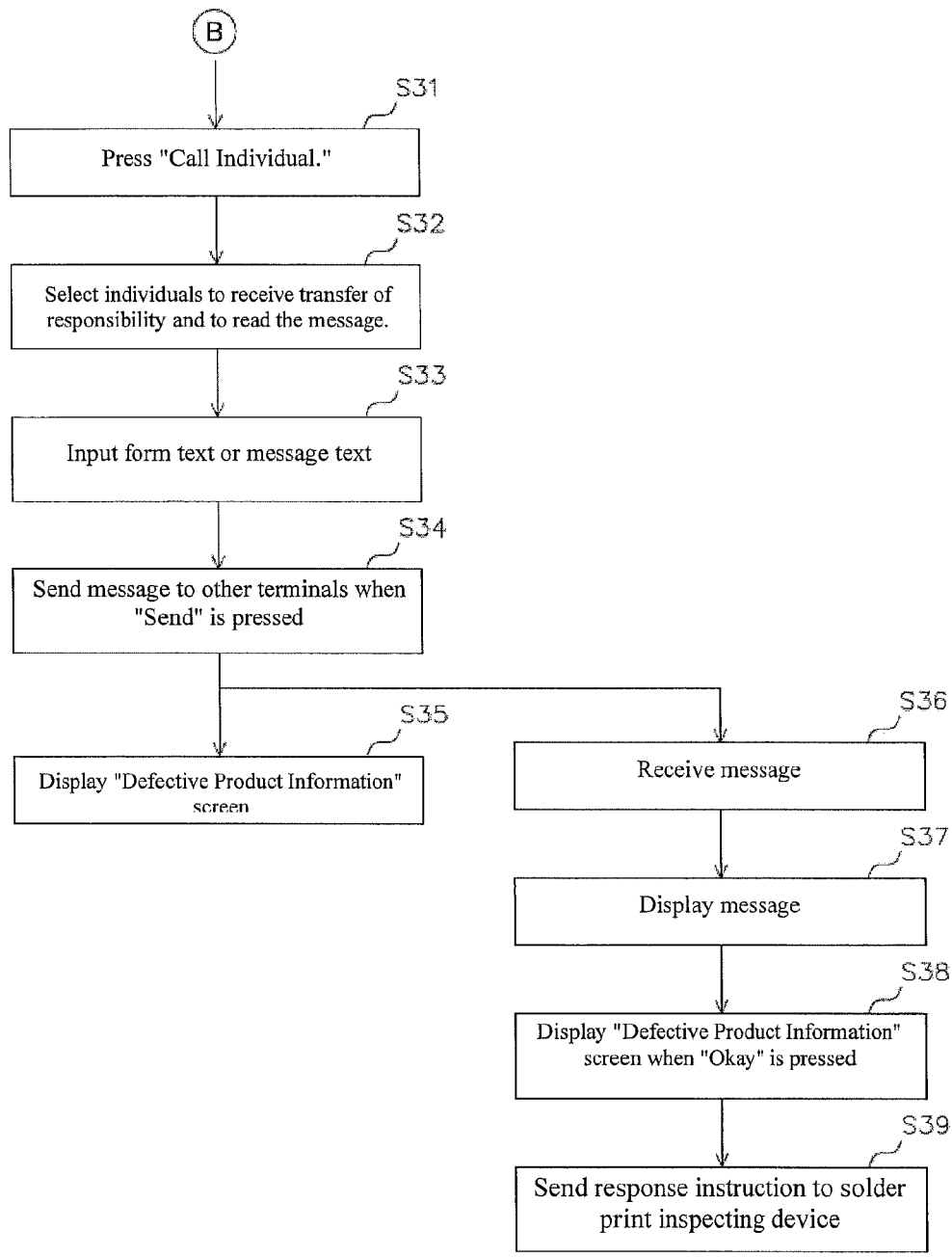
FIG. 11 is a flowchart for explaining the flow regarding processing operations when a defective product has been produced, and, in particular, regarding a call to an individual.
Figure 14:
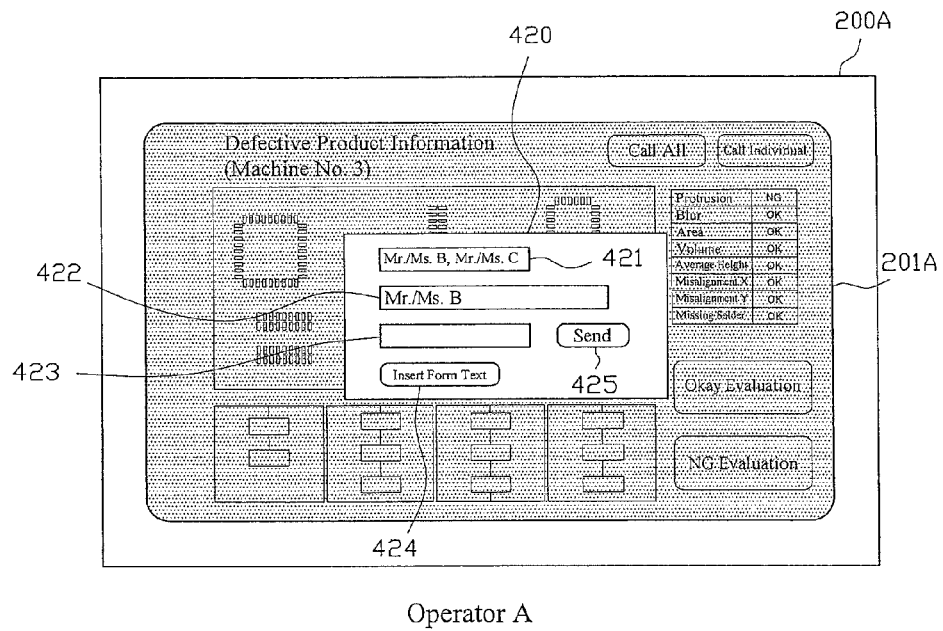
FIG. 14 is a schematic diagram illustrating one example of the state of a display on a mobile terminal in the flow regarding the processing operations when a defective product has been produced, and regarding, in particular, a call to an individual.

The case wherein the "Call Individual" button 356 has been pressed will be explained next. As illustrated in FIG. 11, if the specific operator (for example, Operator A) presses the "Call Individual" button 356 on his or her mobile terminal 200 in Step S31, following Step S10, above, the Send Message screen 420 (referencing FIG. 14) will be displayed as a pop-up over the "Defective Product Information" screen.

The Send Message screen 420 is provided with a Message Recipient field 421, a Authorized Party field 422, a Message field 423, an "Insert Form Text" button 424, and a "Send" button 425.

In the Message Recipient field 421, one or more operators are set, as recipients to whom a message is to be sent, selected from an operator list that has been registered in advance (Step S32). Operators B and C are set in the example in FIG. 14.

In the Authorized Party field 422, one or more operators, to whom the authorization is to be transferred, are set through selecting from an operator list that has been registered in advance (Step S32). Operator B is set in the example in FIG. 14.

Following this, the "Insert Form Text" button 424 is pressed, or specific inputting units are used, to input form text or message text into the Message field 423 (Step S33).

Thereafter, the "Send" button 425 is pressed to send the message to the mobile terminal(s) 200 of the specified operator(s) set in the aforementioned Message Recipient field 421 and the Authorized Party field 422 (Step S34).

By sending this message, the specific operator loses the authorization for the checking task for the printed substrate 1 for which there has been a defective-product evaluation, but the "Defective Product Information" screen continues to be displayed on the displaying portion 201 of the mobile terminal 200 of the specific operator (Step S35). However, the "Okay Evaluation" button 353 and the "NG Evaluation" button 354 are grayed out, causing them to the inoperable.

On the other hand, when the aforementioned message is received by the mobile terminal 200 of another operator (Step S36), then a Message Received screen is displayed as a pop-up over the "Production Control" screen (Step S37).

Figure 15:
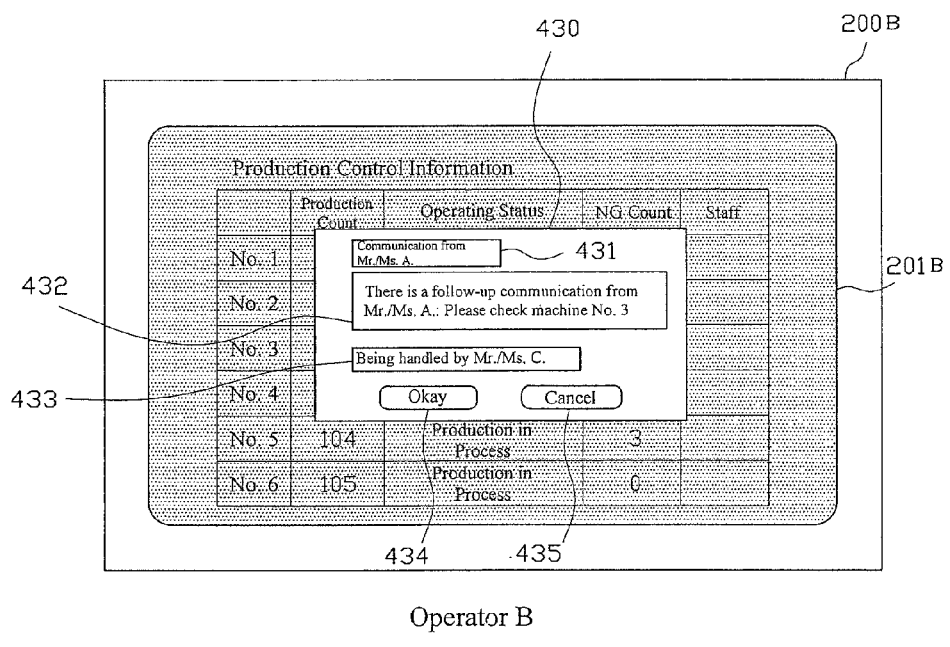
FIG. 15 is a schematic diagram illustrating one example of the state of a display on a mobile terminal in the flow regarding the processing operations when a defective product has been produced, and regarding, in particular, a call to an individual.

As a specific example, a Message Received screen 430 (referencing FIG. 15) is displayed as a pop-up over the "Production Control" screen on the displaying portion 201B of the mobile terminal 200B of only the selected Operator B to whom the message has been sent.

The Message Received screen 430 is provided with a Sender field 431, a Message field 432, an Authorized Party field 433, an "Okay" button 434, and a "Cancel" button 435. If the "Okay" button 434 is pressed here, then after the name of the operator to whom the Authorization is to be transferred is displayed in the Authorized Party field 433, then, after a brief time, the Message Received screen 430 is closed on the displaying portion 201B of the mobile terminal 200B of the Operator B, and the "Defective Product Information" screen is displayed (Step S38).

Note that because Operator B is not given authorization for the checking task, the "Okay Evaluation" button 353 and the "NG Evaluation" button 354 are grayed out, and are inoperable.

If the "Cancel" button 435 is pressed, then the "Production Control" screen is restored, without displaying the "Defective Product Information" screen.

Figure 16:
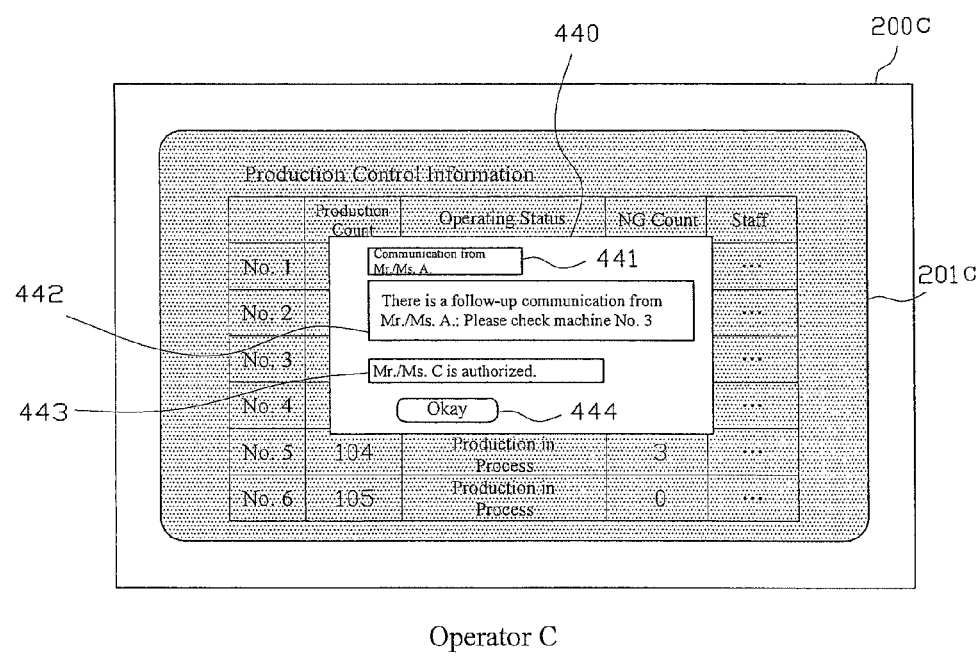
FIG. 16 is a schematic diagram illustrating one example of the state of a display on a mobile terminal in the flow regarding the processing operations when a defective product has been produced, and regarding, in particular, a call to an individual.

On the other hand, a Message Received screen 440 (referencing FIG. 16) is displayed as a pop-up over the "Production Control" screen on the displaying portion 201C of the mobile terminal 200C of the Operator C who was selected as the message recipient and the individual to whom to transfer the authorization.

The Message Received screen 440 is provided with a Sender field 441, a Message field 442, an Authorized Party field 443, and an "Okay" button 444. If the "Okay" button 444 is pressed here, then after one's own name is displayed in the Authorized Party field 443, then, after a brief time, the Message Received screen 440 is closed on the displaying portion 201C of the mobile terminal 200C of the Operator C, and the "Defective Product Information" screen is displayed (Step S38).

Given this, the operator (for example, an Operator C) that has received the authorization in this way references the image data, and the like, displayed in the "Defective Product Information" screen, following the same procedure set forth above, to evaluate whether or not the evaluation result for the printed substrate 1 (the printed state of the cream solder 3) for which there is the defective-product evaluation is correct, and presses the "Okay Evaluation" button 353 or the "NG Evaluation" button 354, to send a response instruction to the solder print inspecting device 21 (Step S39).

As described in detail above, when, in the present embodiment, there is a defective-product evaluation in the solder print inspecting device 21 that is subject to monitoring, information pertaining thereto is sent to mobile terminals 200 possessed by operators. An operator views the notification to perform, through the mobile terminal 200, a checking task for evaluating whether or not the evaluation result for the printed substrate 1 for which there has been a defective-product evaluation is correct. An operating instruction based on the evaluation result is sent to the solder print inspecting device 21 wherein the printed substrate 1 is temporarily stopped. If here correction information indicating that the defective-product evaluation is to be corrected to a non-defective-product evaluation is sent from the mobile terminal 200 to the applicable solder print inspecting device 21, then the solder print inspecting device 21 corrects the defective-product evaluation to a non-defective-product evaluation, and the temporary stop of the printed substrate 1 is released.

The structure set forth above makes it possible to perform the checking tasks, described above, on the spot, through the mobile terminal 200, without the operator having to go to the trouble to go to the solder print inspecting device 21, even when there has been a defective product on the specific solder print inspecting device 21. That is, the time for the operator to go to the solder print inspecting device 21 is eliminated, enabling a reduction in the time over which the solder print inspecting device 21 is stopped. The result is an increase in the operating efficiency and an increase in the availability rate of the inspecting device, which, by extension, enables an increase in the availability rate of the production line enabling an improvement in productivity.

In other words, even if the operator is assigned to a different task in a location that is different from that of the solder print inspecting device 21, it is possible to perform the checking task from there, enabling the achievement of an increase in the overall operating efficiency.

Furthermore, in the present embodiment, when a specific operator uses his or her mobile terminal 200 to select a specific task item as a task that he or she will perform, the task item will be displayed in a specific state (grayed out) on the mobile terminals 200 possessed by the other operators, to indicate that that task item has been selected. Doing so enables the other operators to ascertain that the specific operator will be responsible for the checking task for that task item.

As a result, only the operator who has selected the task item displayed on the mobile terminal 200 will perform the checking task for that task item, thereby making it possible to prevent problems such as a plurality of operators, who have received identical information, performing the same checking task at the same time, even if there are multiple operators who possess mobile terminals 200.

In addition, because the structure is one wherein the task to be performed by an individual can be selected on the operator side, problems such as an operator becoming idle, or a single operator receiving multiple tasks simultaneously, are less likely than in a structure wherein an operator for performing a specific task is designated by the system side alone.

The result is the ability for a plurality of operators to monitor solder print inspecting devices 21 more efficiently, which, by extension, enables the achievement of improved productivity. This is particularly true when a plurality of solder print inspecting devices 21 is monitored.

Note that there is no limitation to the detail set forth in the embodiments described above, but rather the embodiments may be, for example, as follows. Of course, other examples of application and examples of modifications, not illustrated in the below, are possible.

(a) While in the embodiments set forth above a solder print inspecting device 21 was presented as an example of an inspecting device that is monitored by the monitoring system 100, the inspecting devices monitored by the monitoring system 100 are not limited thereto, but rather other inspecting devices can be the subject of monitoring.

However, the present invention is more effective in a structure for performing monitoring of inspecting devices that are stopped temporarily, and require some sort of checking task, when there is a defective-product evaluation for an inspection object.

Moreover, it is more effective in a structure wherein an external appearance inspecting device that inspects the external appearance of the inspection object, wherein the operator is able to evaluate visually, through a mobile terminal 200, is monitored. As external view inspecting devices there are, in addition to, for example, the solder print inspecting device 21, a mounting status inspecting device 22, or a soldering status inspecting device 23.

Note that while, in the embodiments set forth above, that which was monitored by the monitoring system 100 was only solder print inspecting devices 21, the structure may instead be one wherein various different types of inspecting devices are monitored in a structure wherein various different types of external appearance inspecting devices (solder print inspecting devices 21, mounting status inspecting devices 22, soldering status inspecting devices 23) are used, as in the embodiments set forth above.

Of course, that which is subject to inspection by the inspecting devices is not limited to the printed substrate 1 of the embodiments set forth above, but rather other inspection objects, such as resin-fabricated products, or the like, may be used instead.

(b) While, in the embodiments set forth above, smart phones and tablet PCs, and the like, were listed as examples of mobile terminals 200, there is no limitation thereto, but rather existing mobile telephones, notebook PCs, or the like, may be used as well. Of course, rather than a touch panel, a normal liquid crystal display device, or the like, may be used as the displaying unit, and a mouse, a keyboard, and the like may be used as the inputting unit.

(c) While in the embodiments set forth above the structure was one wherein a variety of production control information was received through the mobile terminal 200 sending a data request signal to the various solder print inspecting devices 21, there is no limitation thereto, but rather the structure may be one wherein production control information is sent periodically from the solder print inspecting devices 21 to the mobile terminals 200.

Moreover, the structure may be one wherein a control server performs centralized control of the production control information for the individual solder print inspecting devices 21, provided with a control server that is connected so as to be able to communicate with the individual solder print inspecting devices 21 through an on-site LAN, and may be structured wherein the various production control information for the individual solder print inspecting devices 21 is obtained by the mobile terminals 200 from the control server.

(d) The network structure (the on-site LAN) is not limited to the embodiments set forth above.

For example, while in the embodiments set forth above the structure was one wherein the communication controlling devices 66 of the individual solder print inspecting devices 21 were connected through LAN cables (in a wired LAN), there is no limitation thereto, but rather these may be connected through a wireless LAN.

Moreover, it is not absolutely necessary that the individual solder print inspecting devices 21 be connected together in a network, but rather all that is necessary is to form communication circuits wherein, at least, the individual solder print inspecting devices 21 and the mobile terminals 200 can exchange data. In regards to the communication circuit as well, it is not absolutely necessary that an in-house dedicated network be structured, but rather the structure may use a public mobile telephone network, a public wireless LAN, or the like, as the communication circuit.

Moreover, while, in the embodiments set forth above, a communication controlling device 66 and a tower light 67 were provided for each individual solder print inspecting device 21, there is no limitation thereto, but rather the structure may be one wherein these functions are provided external to the solder print inspecting device 21. Moreover, it is not absolutely necessary that they be provided with a one-to-one correspondence with the individual solder print inspecting devices 21.

Furthermore, while, in the embodiments set forth above, no particular wireless communication standards for structuring the wireless LAN were mentioned, any wireless communication standard may be used insofar as the structure is able to exchange data using wireless communication, such as Wi-Fi® or Bluetooth®.

(e) While in the embodiments set forth above the structure was one wherein the mobile terminals 200 received production control information periodically from each of the solder print inspecting devices 21 even when in a normal "production in process" state, wherein the operating status of the individual solder print inspecting device 21 was not "temporary stop," and the operating status of each individual solder print inspecting device 21 was displayed in the operating status table 300, there is no limitation thereto, but rather the structure may be one wherein the information is provided only when, at least, the operating status of a solder print inspecting device 21 goes to "temporary stop."

(f) The detail of the display fields 301 displayed in the operating status table 300 are not limited to those of the embodiments set forth above, but rather should display, at least, the machine number of the solder print inspecting device 21 that is subject to monitoring, and the operating status thereof. The structure may be one wherein information for content that differs from that of the embodiments set forth above is displayed.

(g) In the embodiments set forth above the mobile terminal 200 of another individual who has received selection information indicating that a specific operator has selected a display field 301 indicates that that display field 301 has been selected, through graying out, in the operating status table 300, the fields for the display fields 301 that have been selected by a mobile terminal 200 of a sender who has sent selection information. However, there is no limitation thereto, and instead the display field 301 having been selected may be indicated in a different way, such as through displaying a specific message, placing a check mark in the display field 301, or the like.

(h) In the embodiments set forth above, once the "Operating Status" item of the display field 301 in a mobile terminal 200 is grayed out, one is not given the authorization for the task, and the checking task for that display field 301 cannot be selected. Moreover, the structure was one wherein if one were to press the applicable display field 301 to select it, then although the displaying portion 201B of the mobile terminal 200 would switch to the "Defective Product Information" screen, there would be a pop-up display 400, so that the "Defective Product Information" screen could not be viewed.

However, there is no limitation thereto, and instead the pop-up display 400 may be closed after a brief time (for example, three seconds), in a structure where even an operator that is not given the authorization for the task can view the "Defective Product Information" screen.

In this case, of course preferably the "Okay Evaluation" button 353 and the "NG Evaluation" button 354 are grayed out, or the like, so that the task cannot be performed by one who is not given authorization for the task.

However, the structure may instead be one wherein, conversely, a plurality (all) of the operators is given authorization for the task, insofar as the individual operators coordinate with each other, where everyone is able to view the "Defective Product Information" screen at the same time, and can operate the "Okay Evaluation" button 353 and the "NG Evaluation" button 354.

(i) While in the embodiments set forth above buttons were provided for the "Okay Evaluation" button 353 and the "NG Evaluation" button 354, in consideration of the fact that only rarely is there a printed substrate 1 wherein a defective-product evaluation is confirmed and the printed substrate 1 is handled as a defective product, the "NG Evaluation" button 354 for confirming the defective-product evaluation, the branching device 31, the defective product storing portion 41, and the like, may be omitted, and instead the operator may, at that time, reject a defective product through a manual operation.

(j) The structure for the temporary stopping unit for stopping temporarily the defect rejection of a printed substrate 1 for which a defective-product evaluation has been made when there has been a defective-product evaluation in the solder print inspecting device 21 is not limited to a structure wherein the operation for conveying the printed substrate 1 out by the pedestal 9 is temporarily stopped, but rather may be, for example, a structure wherein the defect rejection of at least the printed substrate 1 to the defective product storing portion 41 is temporarily stopped by, for example, temporarily stopping the conveyor 25 or the branching device 31 by outputting a temporary stop signal to, for example, the conveyor 25 or the branching device 31 that are on the downstream side, or a structure wherein, after the inspection has been completed, the printed substrate 1 for which there is a defective-product evaluation, is conveyed out of the solder print inspecting device 21. In such a structure, the function for outputting the temporary stopping signal structures the "temporary stopping unit for temporarily stopping the defect rejection."

(k) In the embodiments set forth above, although not particularly mentioned, an "operator list" may be provided whereby the task status of all of the operators can be understood, and, for example, when a message is sent to the mobile terminals 200 of all of the operators through, for example, the "Call All" button 355, the structure may be one wherein the message is sent only to all of the operators who are free, not in the middle of a task.

Moreover, the structure may be one wherein a priority order may be established for the individual operators in advance in the operator list, where, rather than sending the message all at once, a priority sequence is followed to send the message (to transfer authorization) one at a time.

Moreover, the structure may be one wherein grouping is performed, depending on skill levels, or the like, into a group of operators who can receive, for example, the transfer of authorization and a group of operators who cannot receive the transfer of authorization, and wherein a group can be specified to send a message to all of the operators within the group.

Moreover, the structure may be one wherein, when a message is sent and authorization is transferred through the "Call Individual" button 356, the "operator list" is referenced and an operator who is free is selected therefrom in order to send the message and transfer the authorization.

The various structures described above reduce the likelihood of problems such as a single operator receiving a plurality of tasks simultaneously, and enable the achievement of an improvement in production efficiency.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF REFERENCE CHARACTERS

1: Printed Substrate
3: Cream Solder
10: Production Line
21: Solder Print Inspecting Device
31: Branching Device
55: Controlling Device
61: Central Processing Device
65: Inspection Information Storing Device
66: Communication Controlling Device
67: Tower Light
100: Monitoring System
200: Mobile Terminal
201: Displaying Portion
300: Operating Status Table
301: Display Field 353: "Okay Evaluation" Button
354: "NG Evaluation" Button
355: "Call All" Button
356: "Call Individual" Button

What is claimed is:

1. An inspecting device monitoring system for monitoring an operating status of one or more inspecting devices that includes an inspecting unit that performs specific inspections regarding specific inspection objects that are conveyed and arrive sequentially, and an evaluating unit that performs defective-product or non-defective-product evaluations on the inspection objects of based on inspection information obtained by the inspecting unit, the system comprising:

one or more mobile terminals, each including a communicating unit that communicates with the one or more inspecting devices through a specific communication circuit, wherein each of the one or more inspecting devices comprises:

a temporary stopping unit that stops temporarily defective-product rejection of, at least, an inspection object relating to a defective-product evaluation, when there has been a defective-product evaluation by the evaluating unit; and a communicating unit that communicates with the one or more mobile terminals through the communication circuit, and that, when there is a temporary stop of the inspection object relating to the defective-product evaluation, sends to the one or more mobile terminals operating information for the inspecting device indicating the temporary stop and inspection information relating to the inspection object relating to the defective-product evaluation; and wherein each of the one or more mobile terminals comprises:

a displaying unit that displays, as a task item, information indicating a need for a checking task for the inspection object relating to the defective-product evaluation, by at least an operator of the mobile terminal, based on operating information received from the inspecting device when at least the inspecting device includes temporarily stopped the inspection object pertaining to the defective-product evaluation, and that displays the inspection information received from the inspecting unit; and an inputting unit that accepts from the operator of the mobile terminal through at least the displaying unit an input of an evaluation result of an evaluation regarding the whether the evaluation result regarding the inspection object that has been evaluated as a defective product is correct;

wherein, when correction information for correcting the defective-product evaluation to a non-defective-product evaluation, as an operator instruction based on the evaluation result by the operator, is sent from the mobile terminal to the inspecting device, the inspecting device corrects the defective-product evaluation to a non-defective-product evaluation, and releases the temporary stop.

2. The inspecting device monitoring system as set forth in claim 1, further comprising:

a rejecting unit that rejects an inspection object relating to a defective-product evaluation when there has been a defective-product evaluation by the evaluating unit, wherein, when confirming information indicating a confirmation of the defective-product evaluation, as an operator instruction based on an evaluation result by the operator is sent from the mobile terminal to the inspecting device, the inspecting device releases the temporary stop and outputs a rejection signal, to the rejecting unit, indicating that the inspection object relating to the defective-product evaluation is to be rejected.

3. An inspecting device monitoring system for monitoring an operating status of one or more inspecting devices that include an inspecting unit that performs specific inspections regarding specific inspection objects that are conveyed and arrive sequentially, and an evaluating unit that performs defective-product or non-defective-product evaluations on the inspection objects of based on inspection information obtained by the inspecting unit, the system comprising:

a plurality of mobile terminals, each including a communicating unit that communicates with the one or more inspecting devices and that communicates with another mobile terminal through a specific communication circuit, wherein each of the one or more inspecting devices comprises:

a temporary stopping unit that stops temporarily defective-product rejection of, at least, an inspection object relating to a defective-product evaluation, when there has been a defective-product evaluation by the evaluating unit; and a communicating unit that communicates with the plurality of mobile terminals through the communication circuit, and that, when there is a temporary stop of the inspection object relating to the defective-product evaluation, sends to the plurality of mobile terminals operating information for the inspecting device indicating the temporary stop and inspection information relating to the inspection object relating to the defective-product evaluation; and wherein each of the one or more mobile terminals comprises:

a displaying unit that displays, as a task item, information indicating a need for a checking task for the inspection object relating to the defective-product evaluation, by at least an operator of the mobile terminal, based on operating information received from the inspecting device when at least the inspecting device has temporarily stopped the inspection object pertaining to the defective-product evaluation, and that displays the inspection information received from the inspecting unit; and an inputting unit that accepts from the operator of the mobile terminal a selection of a checking task relating to a task item displayed on the displaying unit as a task to be handled by the operator, and accepts from the operator through the displaying unit an input of an evaluation result of an evaluation regarding the whether the evaluation result regarding the inspection object that has been evaluated as a defective product is correct;

wherein, when a specific operator, using a mobile terminal possessed thereby, has selected a checking task relating to a task item displayed on the displaying unit as an operation that the specific operator is to handle himself or herself, information to that effect is sent, as selection information, to a mobile terminal possessed by another operator, and the inspection information is displayed on the displaying unit;

wherein, when the mobile terminal possessed by the other operator has received the selection information, a fact that the task item relating to the selection information has been selected is displayed by a specific status; and wherein, when correction information for correcting the defective-product evaluation to a non-defective-product evaluation, as an operator instruction based on the evaluation result by the specific operator, is sent from the mobile terminal possessed by the specific operator to the inspecting device, the inspecting device corrects the defective-product evaluation to a non-defective-product evaluation, and releases the temporary stop.

4. The inspecting device monitoring system as set forth in claim 3, wherein, for the checking task relating to the task item that the specific operator has selected using the mobile terminal possessed by the specific operator, selection is disabled or execution is disabled in the mobile terminal possessed by the other operator.

5. The inspecting device monitoring system as set forth in claim 4, further comprising:

a authorization transferring unit that transfers authorization for performing the checking task so that the checking task relating to the task item that the specific operator has selected using the mobile terminal possessed by the specific operator is selected or executed in the mobile terminal possessed by the other operator.

6. The inspecting device monitoring system as set forth in claim 5, further comprising:

a particular transferring unit, as an authorization transferring unit, that allows the specific operator to transfer authorization by indicating a particular other operator.

7. An inspecting device monitoring system as set forth in claim 6, further comprising:

a nonspecified transferring unit, as the authorization transferring unit, that allows the specific operator to transfer authorization to a nonspecified other operator.

8. The inspecting device monitoring system as set forth in claim 5, further comprising:

a nonspecified transferring unit, as an authorization transferring unit, that allows the specific operator to transfer authorization to a nonspecified other operator.

9. An inspecting device monitoring system as set forth in claim 3, further comprising:

a rejecting unit that rejects an inspection object relating to a defective-product evaluation when there has been a defective-product evaluation by the evaluating unit, wherein, when confirming information indicating a confirmation of the defective-product evaluation, as an operator instruction based on an evaluation result by the operator is sent from the mobile terminal to the inspecting device, the inspecting device releases the temporary stop and outputs a rejection signal, to the rejecting unit, indicating that the inspection object relating to the defective-product evaluation is to be rejected.

* * * * *